United States Patent [19]

Sato et al.

[11] Patent Number: 5,605,867
[45] Date of Patent: Feb. 25, 1997

[54] METHOD OF MANUFACTURING INSULATING FILM OF SEMICONDUCTOR DEVICE AND APPARATUS FOR CARRYING OUT THE SAME

[75] Inventors: Nobuyoshi Sato; Tomohiro Ohta; Tadashi Nakano; Hiroshi Yamamoto, all of Chiba, Japan

[73] Assignee: Kawasaki Steel Corporation, Kobe, Japan

[21] Appl. No.: 34,748

[22] Filed: Mar. 15, 1993

[30] Foreign Application Priority Data

| Mar. 13, 1992 | [JP] | Japan | 4-055336 |
| Apr. 7, 1992 | [JP] | Japan | 4-085554 |
| Jun. 16, 1992 | [JP] | Japan | 4-156844 |
| Jun. 16, 1992 | [JP] | Japan | 4-156845 |
| Sep. 10, 1992 | [JP] | Japan | 4-242138 |
| Oct. 5, 1992 | [JP] | Japan | 4-266247 |
| Dec. 9, 1992 | [JP] | Japan | 4-329397 |

[51] Int. Cl.⁶ ................................. H01L 21/02
[52] U.S. Cl. ................ 437/235; 437/238; 437/946; 437/978; 148/DIG. 17
[58] Field of Search ................... 437/238, 946, 437/939, 978, 235, 240; 148/DIG. 17

[56] References Cited

U.S. PATENT DOCUMENTS

| 3,341,367 | 9/1967 | Beyerlein | 437/946 |
| 3,597,269 | 8/1971 | Chang et al. | 437/946 |
| 3,615,941 | 10/1971 | Yamada et al. | 437/238 |
| 3,698,948 | 10/1972 | Barone et al. | 437/238 |
| 4,845,054 | 7/1989 | Mitchener | 437/238 |
| 5,028,566 | 7/1991 | Lagendijk | 437/238 |
| 5,166,101 | 11/1992 | Lee et al. | 437/238 |
| 5,204,141 | 4/1993 | Roberts et al. | 437/238 |
| 5,250,468 | 10/1993 | Matsuuka et al. | 437/238 |
| 5,304,515 | 4/1994 | Morita et al. | 437/238 |

FOREIGN PATENT DOCUMENTS

| 61-77695 | 4/1986 | Japan . |
| 1342637 | 1/1974 | United Kingdom . |

OTHER PUBLICATIONS

Wolf, Stanley and Richard N. Tauber, *Silicon Processing for the VLSI Era*, vol. 1, p. 518 (1986).

D. K. Seto et al.; *IBM Technical Disclosure Bulletin*, vol. 9, No. 7; "Vapor Deposition of Silicon Dioxide"; Dec. 1966; p. 747.

Nobuyoshi Sato et al., Japan Journal Applied Physics, Improvement of Gap–Filling Property of $O_3$–tetraethylorthosilicate (TEOS) Film by Ethanol Surface Treatment, vol. 32, pp. L110–L:112, Part 2, No. 1A/B, Jan. 15, 1993.

(List continued on next page.)

*Primary Examiner*—Trung Dang
*Attorney, Agent, or Firm*—Oliff & Berridge

[57] ABSTRACT

In a method of manufacturing an insulating film of a semiconductor device by a chemical vapor deposition, a surface of a semiconductor wafer is treated with an organic compound such as ethanol and methanol, and then the semiconductor wafer is transported into a reaction chamber and an insulating film is deposited on the thus treated surface of the semiconductor wafer by a chemical vapor deposition using a raw material such as organic silicon compound. By treating the surface of the semiconductor wafer with the organic compound prior to the deposition, the filling capability and planarization of the insulating film are improved. Further the insulating film thus formed is free from voids and clacks, and an amount of water contained in the insulating film is very small. The treatment of the surface of the semiconductor wafer can be performed simply by spin coating, spaying, vapor exposing or dipping, so that the throughput can be improved. Moreover, a gas of said organic compound for treating the surface of the semiconductor wafer may be mixed with raw material gas and reaction gas in the reaction chamber.

11 Claims, 19 Drawing Sheets

OTHER PUBLICATIONS

Ikeda, et al., Denki Kagaku, Oxide Film Formation Using $O_3$/Organic-Source APCVD, 56, No. 7, 1988.

Fujino, et al., T. IEE Japan, Characteristics of Atmospheric Pressure CVD Films Deposited Using Organic Silicate/$O_3$ (Base Material Dependence), vol. 111–A, No. 7, 1991.

Pignatel, et al., J. Electrochem. Soc., The APCVD Growth of PSG and BPSG Films Using Tertiarybutyl–phosphine as a Phorphorus Dopant, vol. 138, No. 6, Jun. 1991.

Hosoda, et al., VMIC Conference, The Low Water Absorption TEOS and Ozone APCVD Film Using Low Temperature Annealing, Jun. 9–10, 1992.

Crowell, et al., J. Vac. Sci. Technol. A, Model Studies of Dielectric Thin Film Growth: Chemical Vapor Deposition of $SiO_2$, vol. 8, No. 3, May/Jun 1990.

Tedder, et al., J. Vac. Sci. Technol. A, The Chemical Vapor Deposition of $SiO_2$ form Tetraethoxysilane: The Effect of the Surface Hydroxyl Concentration, vol. 9, No. 3, May/Jun. 1991.

Chiang, et al., VMIC Conference, APCVD $SiO_2$ Film Using Ozone and TEOS for Intermetal Dielectric Application, Jun. 9–10, 1992.

Kishimoto, et al., VMIC Conference, Planarized $SiO_2$ Interlayer Formed by Two Step $O_3$/TEOS APCVD and Low Temperature Annealing, Jun. 9–10, 1992.

Chang, et al., J. Appl. Phys., Ion and Chemical Radical Effects on the Step Coverage of Plasma Enhanced Chemical Vapor Deposition Tetraethylorthosilicate Films, vol. 67, No. 4, Feb. 15, 1990.

Song, et al., VMIC Conference, Intermetal Dielectric Planarization for 0.4 µm Design Rule Double Metal 64 Mega Dram, Jun. 9–10, 1992.

Hasper, et al., J. Electrochem. Soc., Modeling and Optimization of the Step Coverage of Tungsten LPCVD in Trenches and Contact Holes, vol. 138, No. 6, Jun. 1991.

FIG_1
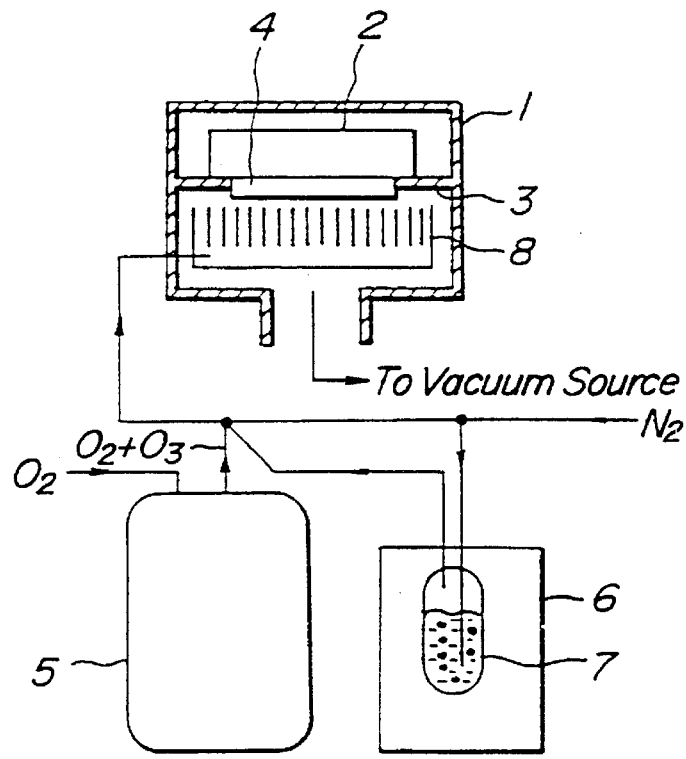
FIG_2
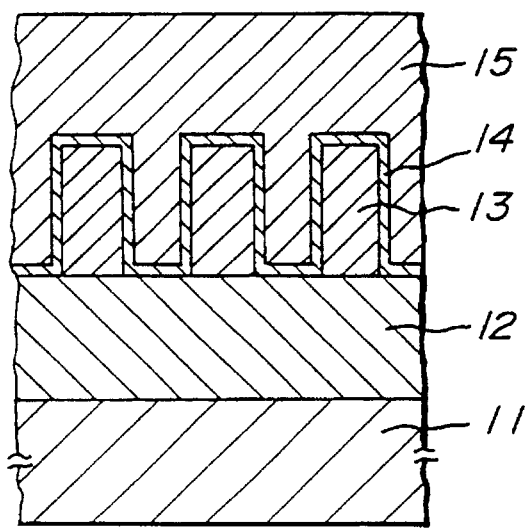

FIG_3
PRIOR ART
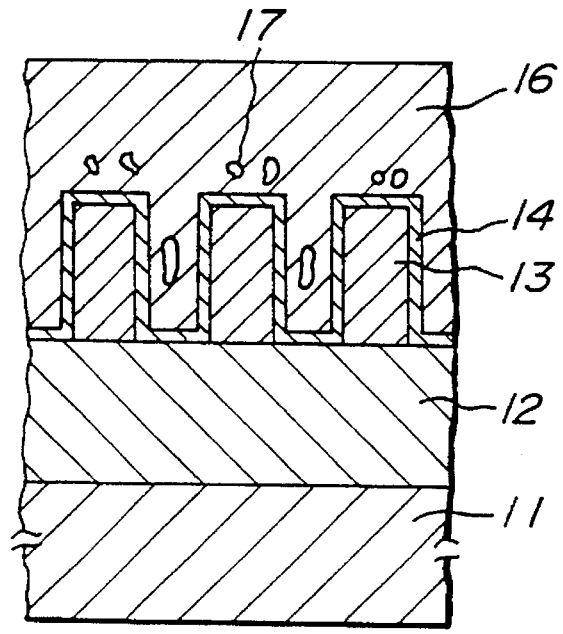
FIG_4
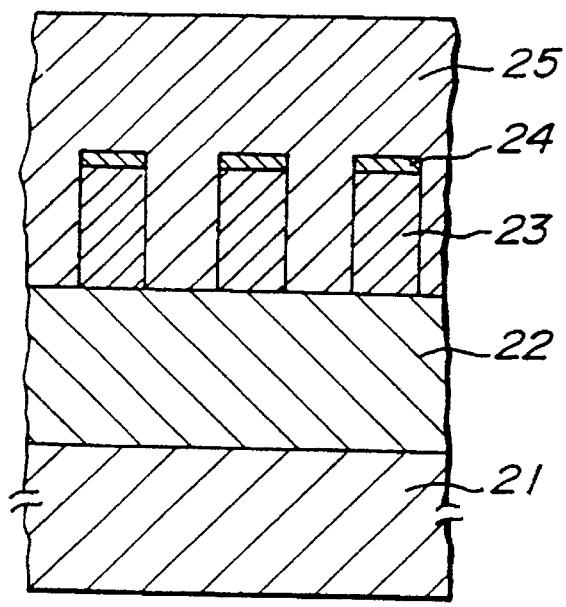

FIG_5
PRIOR ART
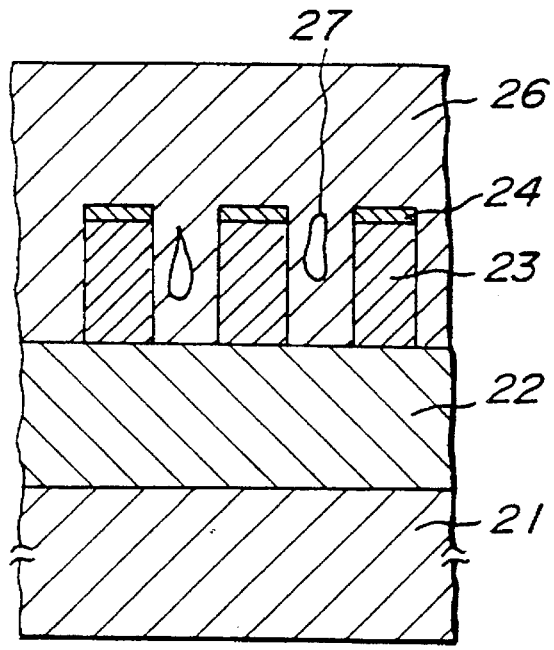
FIG_6
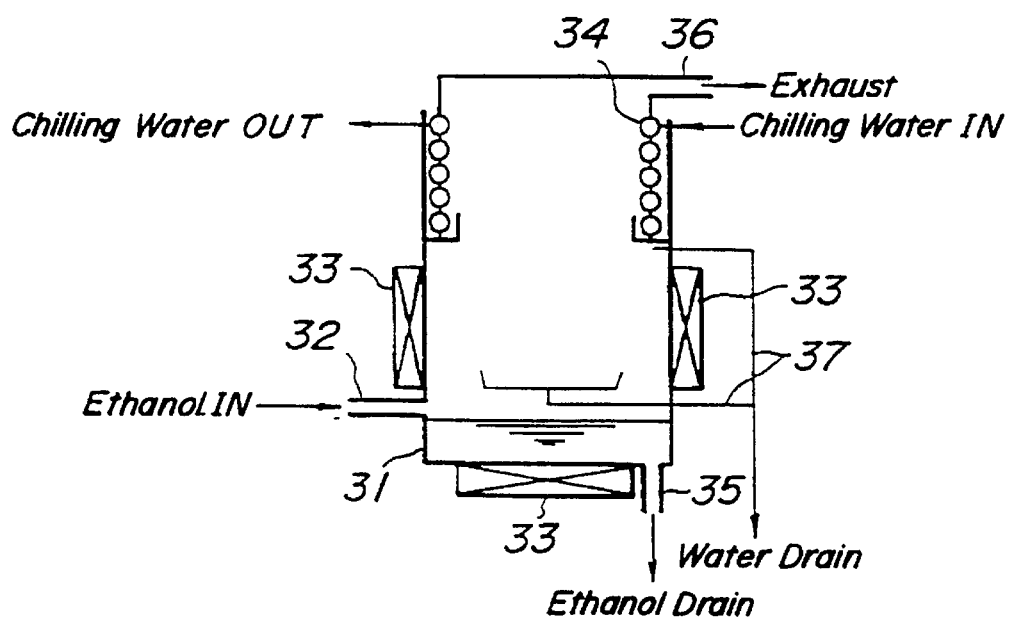

FIG_7A
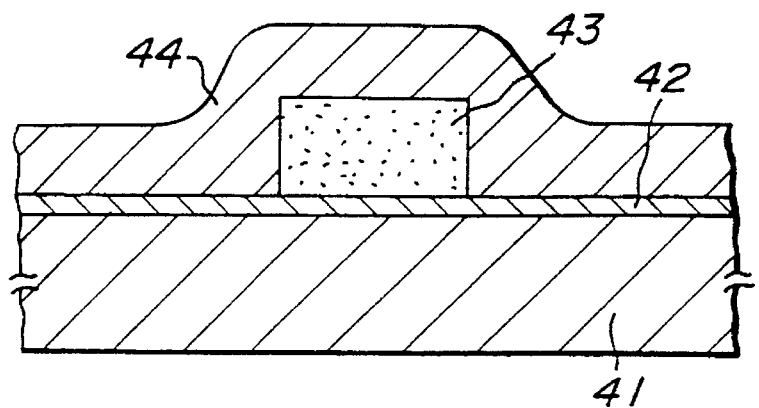
FIG_7B
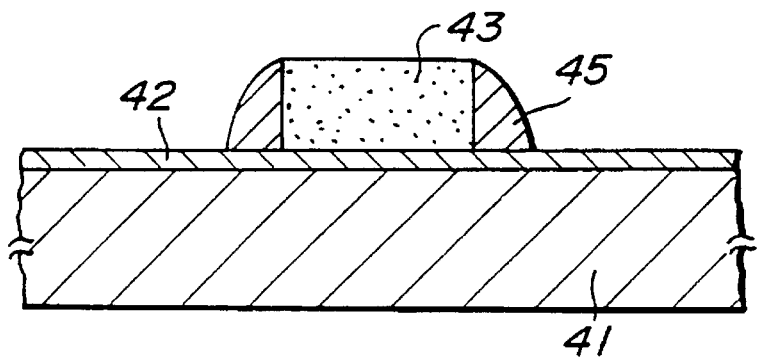
FIG_8
PRIOR ART
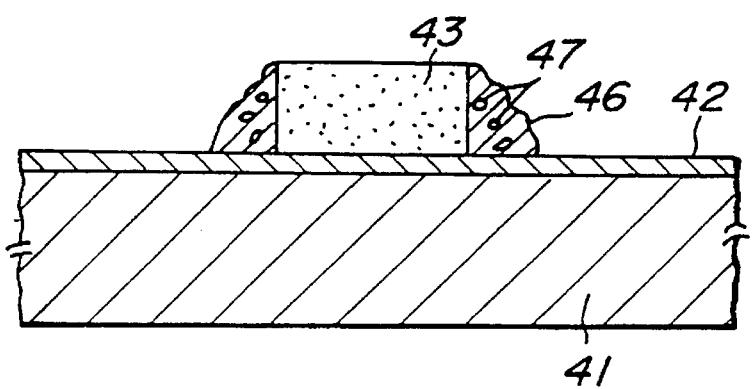

FIG_9A
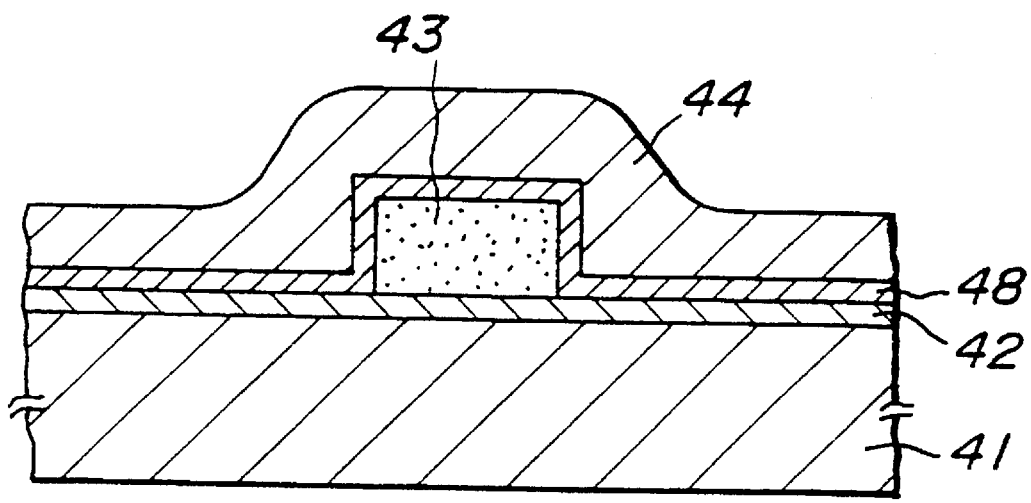
FIG_9B
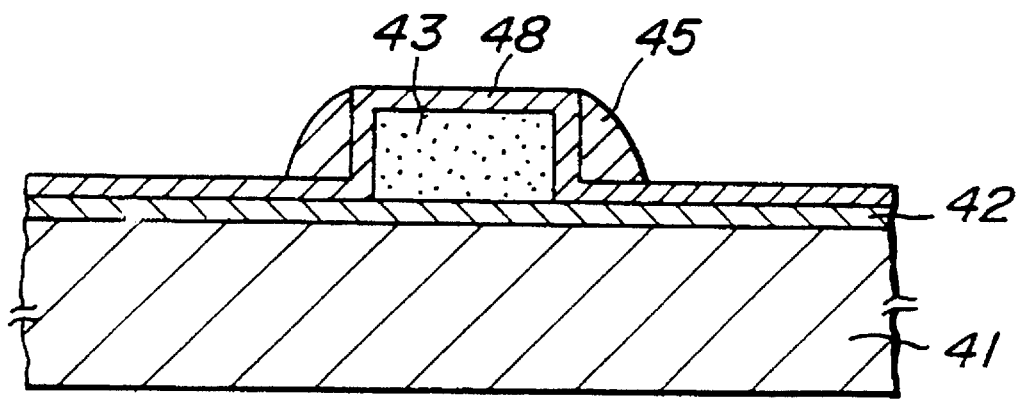

FIG_10
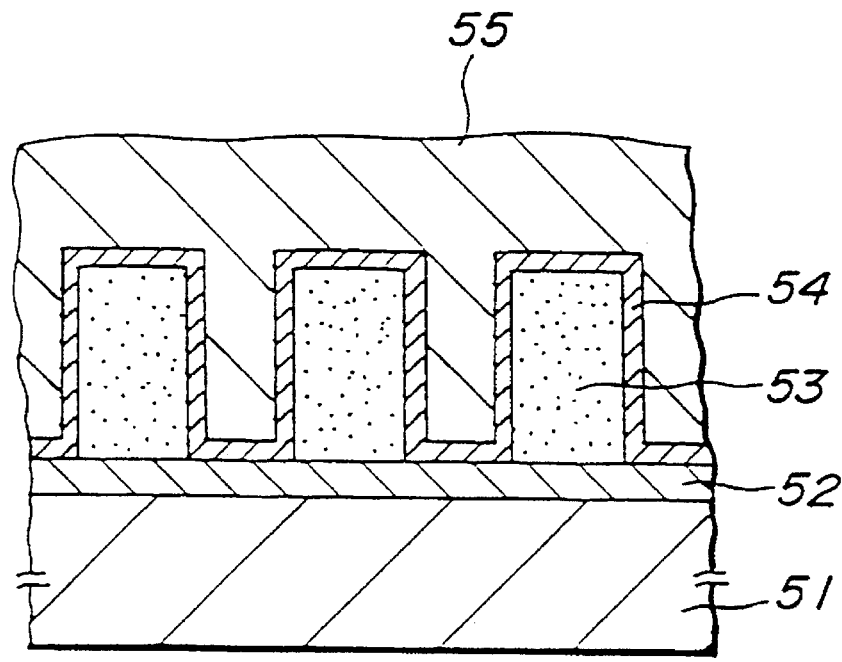
FIG_11
PRIOR ART
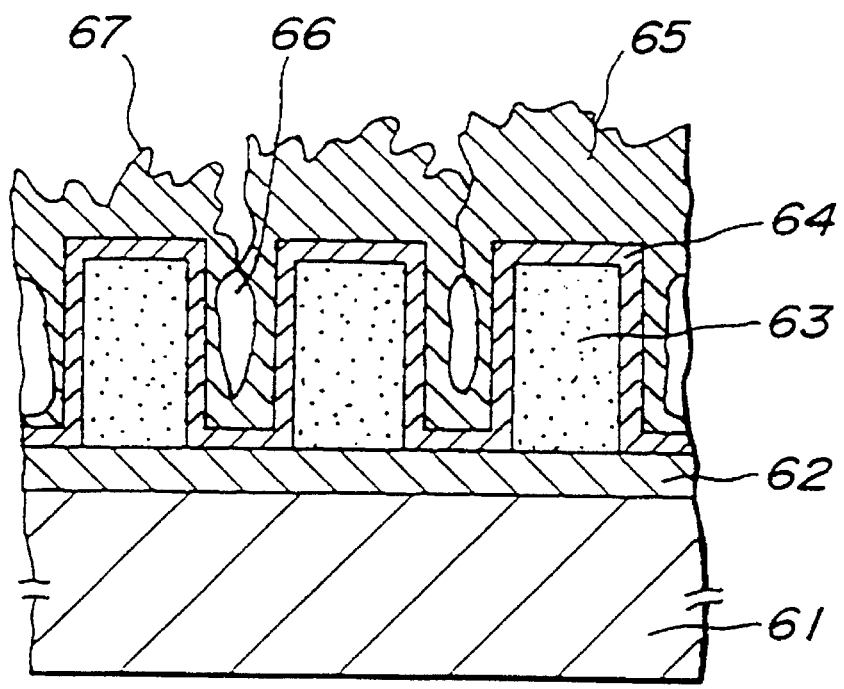

FIG_12
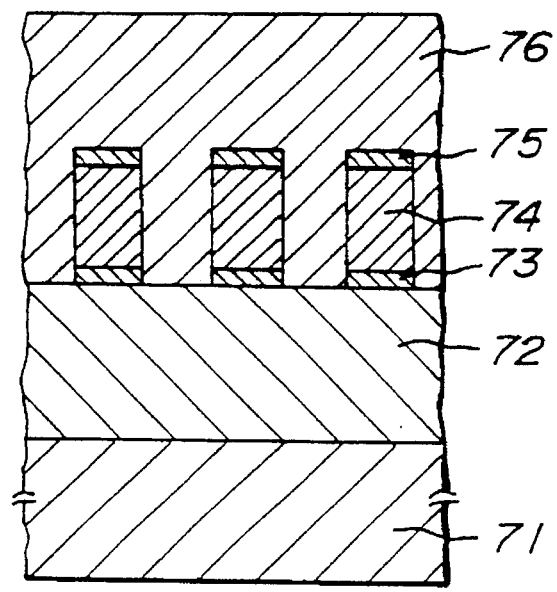
FIG_13
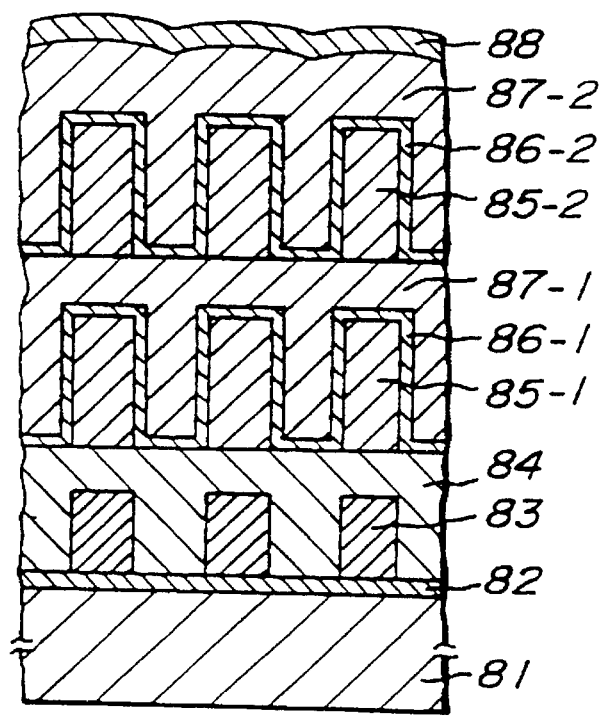

FIG_14
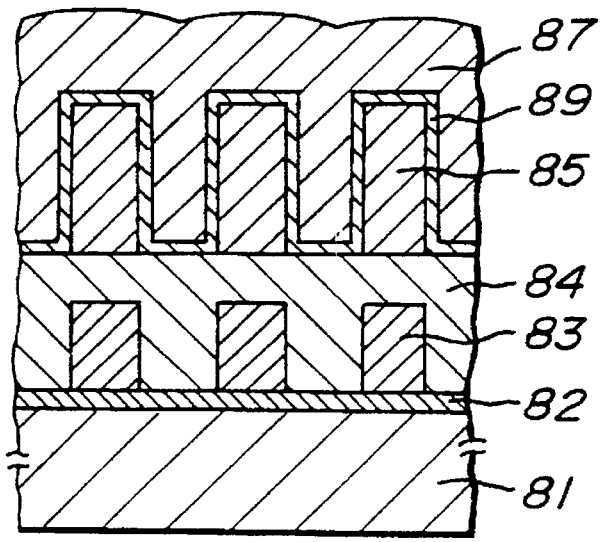
FIG_15
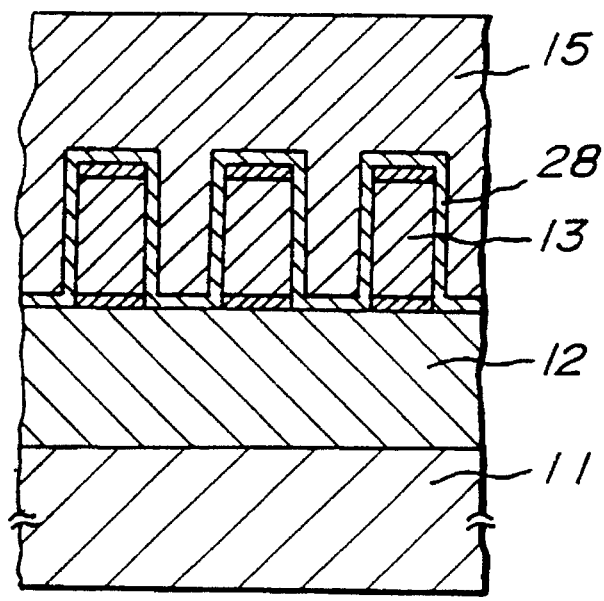

FIG_16
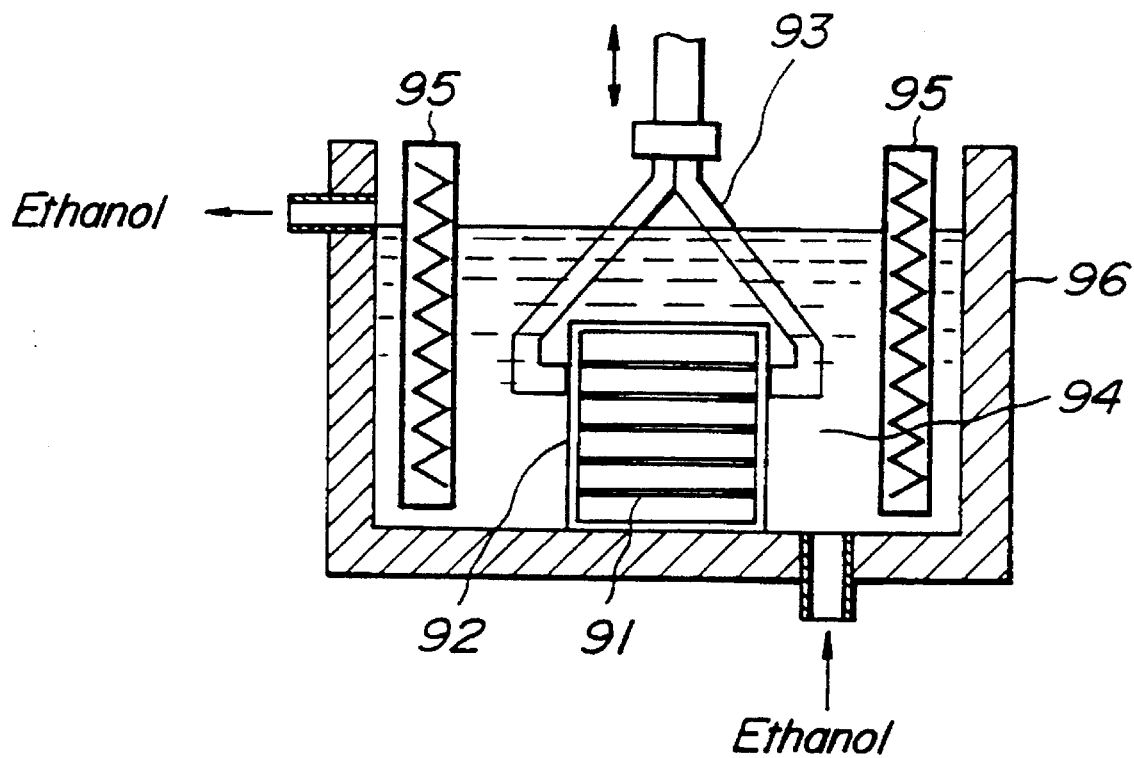

FIG_17
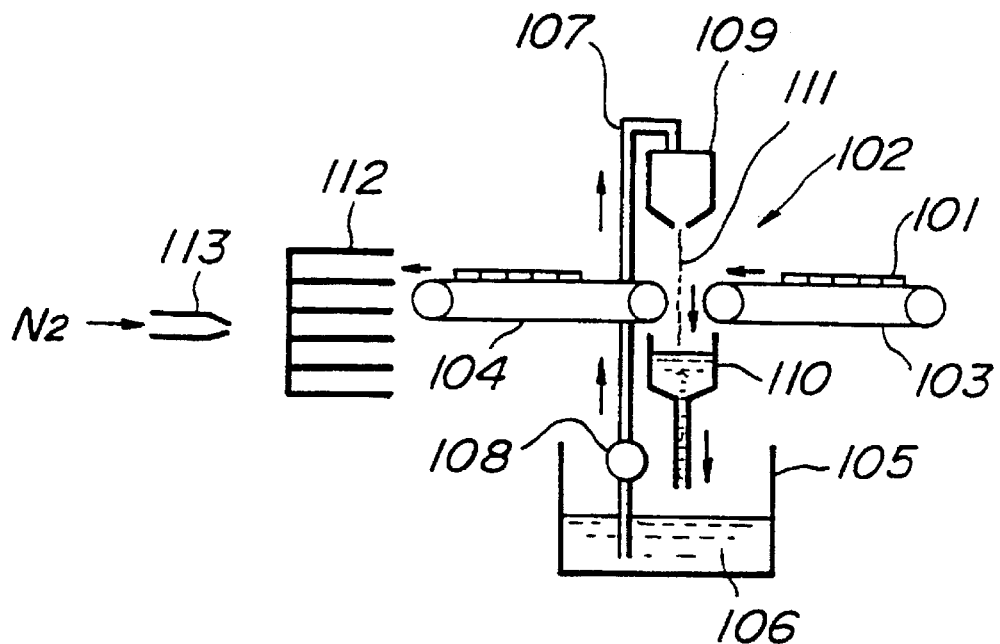
FIG_18
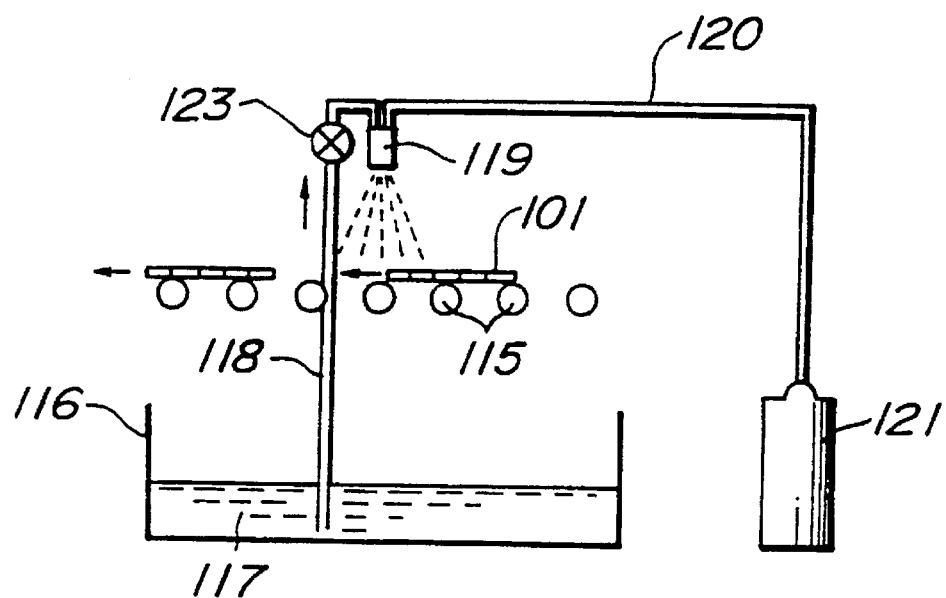

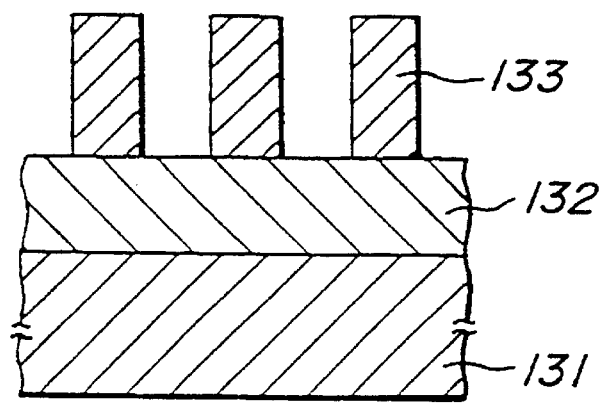
FIG._21A
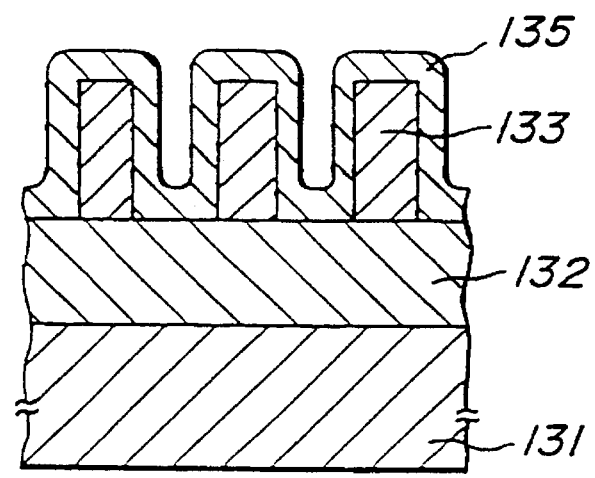
FIG._21B
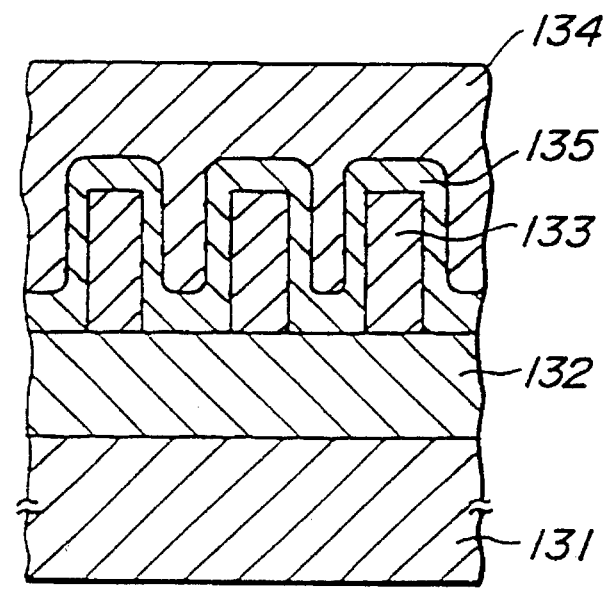
FIG._21C

FIG_22A
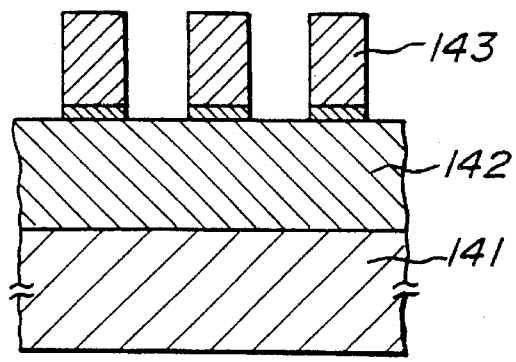
FIG_22B
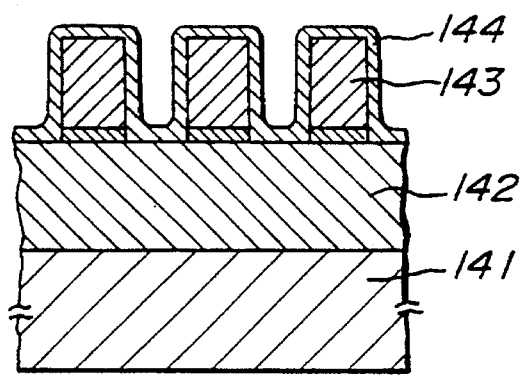
FIG_22C
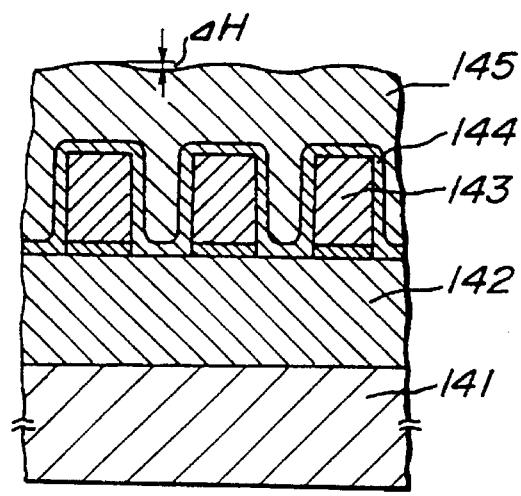

FIG_23
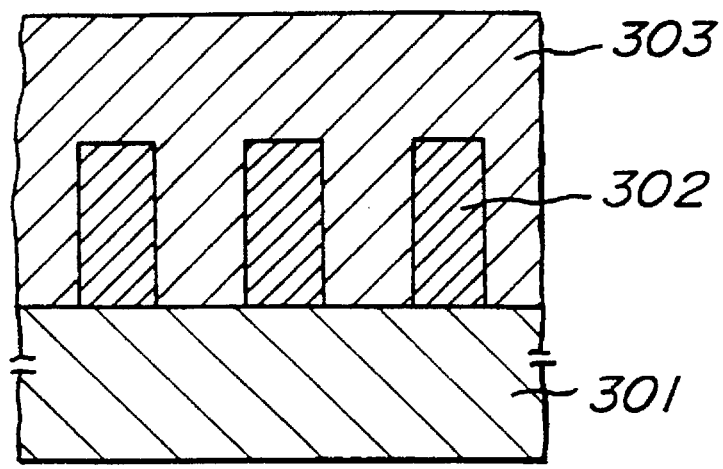

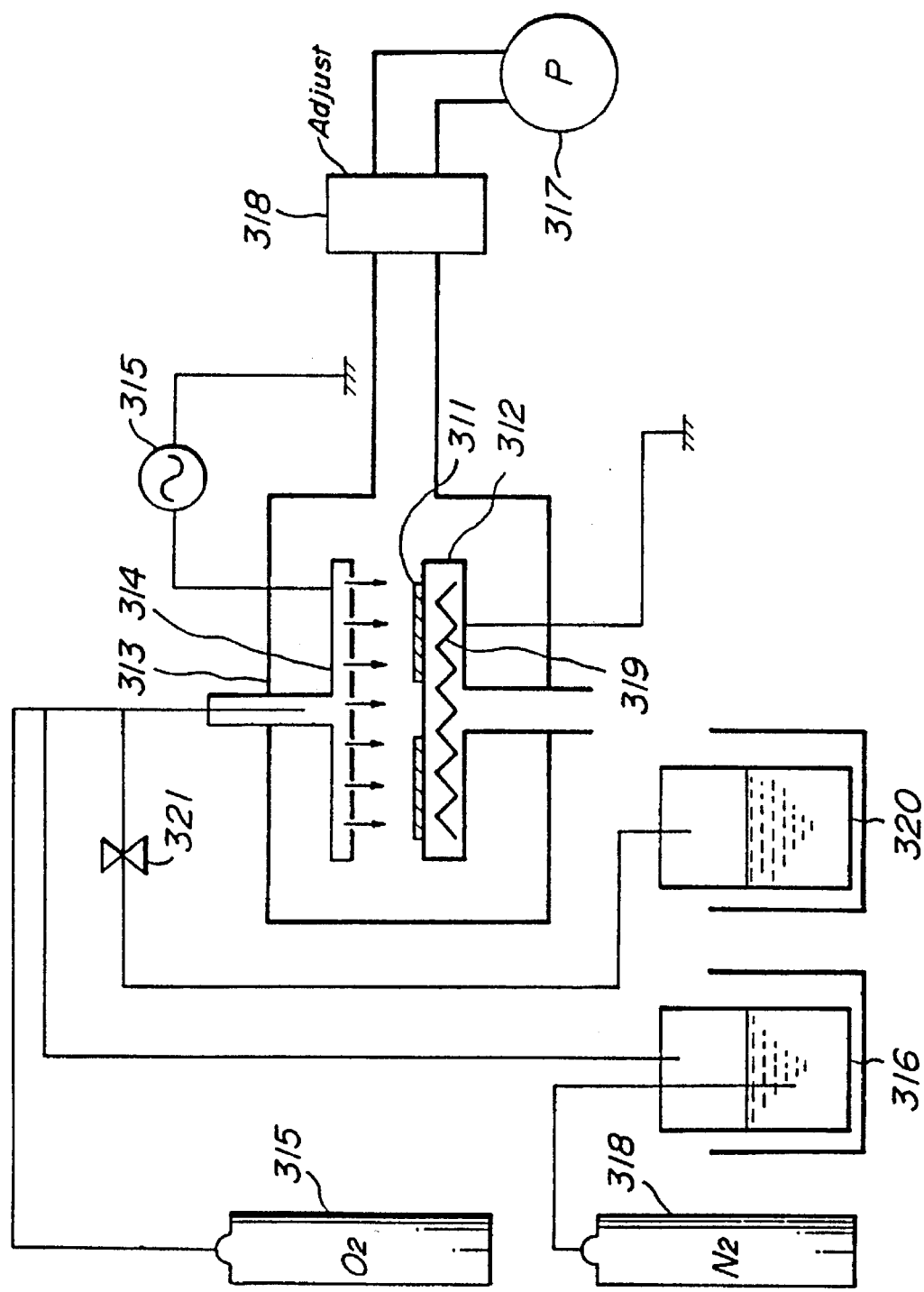
FIG._24

METHOD OF MANUFACTURING INSULATING FILM OF SEMICONDUCTOR DEVICE AND APPARATUS FOR CARRYING OUT THE SAME

FIELD OF THE INVENTION

The present invention relates to a method of manufacturing an insulating film of a semiconductor device, and more particularly to a method of manufacturing by a chemical vapor deposition a primary insulating film provided between a semiconductor substrate and a first metal wiring layer, an interlayer insulating film between successive metal wiring layers, a final insulating film serving as a passivation film, and side walls of a gate electrode of a field effect transistor or metal wiring.

RELATED ART STATEMENT

Nowadays the high integration and high density for VLSI devices have been rapidly progressed and the fabrication technology for manufacturing semiconductor devices of submicron has been required. Due to the development of the submicron technique, a top surface of a semiconductor substrate has very large protrusions and depressions so that an aspect ratio has become very large. This large aspect ratio has posed serious problems in the fabrication technology. The planarized interlayer insulating film has been required for solving one of these problems.

For the interlayer insulating film for use in the sub-micron devices, it has been desired to form a space having a dimension of submicron order and to realize a superior step coverage for a pattern having a high aspect ratio. In order to manufacture an interlayer insulating film having such properties, there has been proposed a chemical vapor deposition (CVD) using inorganic silane and organic silane as a raw material gas. In this case, CVD is carried out as plasma enhanced chemical vapor deposition (P CVD), atmospheric pressure CVD (AP CVD), low pressure CVD (LP CVD), sub-atmospheric CVD (SA CVD), increased pressure CVD, thermal CVD, photochemical CVD (Photo-CVD) and so on.

Among the known CVD methods, AP CVD using a mixture gas of organic silicon compound and ozone is superior to other CVD methods. This AP CVD method using the organic silicon compound and ozone has been described in, for instance Japanese Patent Application Laid-open Publication Kokai Sho 61-77695 and Japanese magazine Electrical Chemistry, 56, No. 7 (1988), pp. 527 to 532. As the organic silicon compound, there have been known TEOS (tetraethoxysilane), TMOS (tetramethoxysilane), OMCTS (octamethylcyclotetrasiloxane), HMDS (hexamethyldisiloxane), SOB (trimethylsilil borate), DADBS (diacetoxyditertiarybutoxysilane) and SOP (trimethylsilil phosphate).

Further, as the final insulating film of the semiconductor device, it has been strongly required to improve the properties of the film which have large influence for the flatness and reliability of devices in accordance with the progress of the high integration and high density. This is due to the fact that the final passivation film has to prevent the intrusion of water.

In the known AP CVD method using the organic silane and ozone, there are several problems that due to the dependency of the deposition rate upon the substrate the insulating film is hardly introduced into a narrow depression in accordance with material of the substrate, so that many voids are formed in the insulating film. The formation of voids in the AP CVD film has been described in Theme A of the Institute of Electrical Engineers of Japan, Vol. 111, No. 7, pp. 652–658, 1991. When the recesses are not filled with the insulating material and the voids are formed in the insulating film, properties of the semiconductor device are affected and a leak current is increased.

Further, in the known CVD film formed by using the organic silane, there are existent a large amount of water containing carbon compounds (unreacted substances) within the insulating film, and thus the quality of the insulating film is deteriorated, the moisture-resistance is also low and cracks might be formed in the insulating film. In order to compensate the low moisture-resistance by increasing the thickness of the insulating film, cracks are liable to be formed which causes the loss of the reliability of semiconductor device.

In order to obviate the above mentioned drawbacks of the known methods of manufacturing the insulating film, there has been proposed to effect a plasma treating by using gas such as $N_2$ and $NH_3$ prior to the AT CVD process using the organic silane. However, in this method, there is another problem that the substrate is subjected to the plasma damage.

SUMMARY OF THE INVENTION

The present invention has for its object to provide a novel and useful method of manufacturing an insulating film of a semiconductor device by the chemical vapor deposition, wherein the above mentioned various drawbacks can be removed or at least mitigated and an insulating film having superior characteristics can be obtained without being subjected to the plasma damage.

It is another object of the invention to provide a method of manufacturing an insulating film of a semiconductor device, said insulating film having an excellent step coverage and having no void formed therein, so that particularly suitable for a submicron semiconductor device.

It is still another object of the invention to provide a method of manufacturing an insulating film of a semiconductor film, in which the insulating film having an excellent property can be formed simply with an addition of a minimum number of process steps so that the throughput can be improved.

According to the invention, a method of manufacturing an insulating film of a semiconductor device comprises the steps of:

preparing a semiconductor substrate;

treating a surface of said semiconductor substrate with a treating fluid comprising at least one organic compound; and forming an insulating film on the thus treated surface of the semiconductor substrate by a chemical vapor deposition.

In a preferable embodiment of the method according to the invention, said insulating film is formed by the chemical vapor deposition using an organic silicon compound. Further, in a preferable embodiment of the method according to the invention, said organic compound of the treating fluid with which said surface of the semiconductor substrate is treated is an organic compound having at least one functional group selected from the group consisting of OH group, CO group, COC group, CN group, $NO_2$ group and $NR_2$ group (R=H or alkyl group). Moreover, heterocyclic compounds may be used as the organic compound of the treating fluid for treating the surface of the semiconductor substrate.

According to further aspect of the invention, a method of manufacturing an insulating film of a semiconductor device comprises the steps of:

preparing a semiconductor substrate having a surface on which an insulating film is to be formed; and forming an insulating film on said surface of the semiconductor substrate by a chemical vapor deposition using a mixture of a raw material gas, a reaction gas and an organic compound gas.

In the method according to the invention, the organic compound for treating the surface of the semiconductor substrate is mixed with the raw material gas such as organic silicon compound, so that it is no more necessary to treat the surface of the semiconductor substrate prior to the chemical vapor deposition and thus the manufacturing process can be made much simpler.

The present invention also relates to an apparatus for manufacturing an insulating film of a semiconductor device and has for its object to provide a novel and useful apparatus, in which the insulating film can be formed reliably at a high throughput.

According to the invention, an apparatus for manufacturing an insulating film on a semiconductor substrate by a chemical vapor deposition comprises:

a pre-treating unit for treating a surface of a semiconductor substrate with a treating fluid comprising at least one organic compound;

a chemical vapor depositing unit for depositing an insulating film on the thus treated surface of the semiconductor substrate by a chemical vapor deposition using an organic silicon compound; and a transporting means for transporting said semiconductor wafer from said pre-treating unit into said chemical vapor depositing unit.

According to the invention, as the organic compound of the treating agent with which the substrate surface is treated or processed prior to the deposition of the insulating film, mention may be made of aliphatic saturated monoalcohols (OH group) such as methanol, ethanol, 1-propanol, 2-propanol, 1-butanol, 2-methyl-1-propanol, 2-butanol, 2-methyl-2-propanol, 1-pentanol, 3-methyl-1-butanol, 3-methyl-2-butanol, 2-methyl-2-butanol, 1-hexanol, cyclohexanol and the like;

aliphatic unsaturated monoalcohols (OH group) such as allyl alcohol, propargyl alcohol, 2-methyl-3-butyn-2-ol and the like;

aromatic alcohols (OH group) such as benzyl alcohol, furfuryl alcohol and the like;

aliphatic saturated polyalcohols and their derivatives (OH group) such as ethylene glycol, propylene glycol, diethylene glycol, ethylene glycol monomethyl ether, ethylene glycol monoethyl ether, ethylene glycol mono-n-butyl ether, ethylene glycol monoisobutyl ether, propylene glycol monomethyl ether, ethylene glycol dimethyl ether, diethylene glycol monomethyl ether, diethylene glycol monoethyl ether, diethylene glycol dimethyl ether and the like;

aldehydes (CO group) such as formaldehyde, acetoaldehyde, glyoxal and the like;

ethers (COC group) such as diethyl ether, dioxane, tetrahydrofuran, tetrahydrofurfuly alcohol and the like;

ketones and ketoalcohols (CO group) such as acetone, 2-butanone, diacetone alcohol, γ-butyrolactone, propylene carbonate and the like;

carboxylic acids (CO group) such as formic acid, acetic acid, propionic acid, glycolic acid, lactic acid, ethyl lactate and the like;

nitroalkanes (NO2 group) such as nitromethane, nitroethane, nitropropane, nitrobenzene and the like;

amines ($NR_2$:R=H or alkyl group) such as ethylamine, propylamine, isopropylamine, butylamine, isobutylamine, allylamine, aniline, toluidine, ethylene diamine, diethylamine, ethylene imine, dipropylamine, diisopropylamine, dibutylamine, triethylamine, tri-n-propylamine, tri-n-butylamine and the like;

acylnitriles (CN group) such as acetonitrile, propionitrile, butyronitrile, acrylonitrile, methacrylonitrile, benzonitrile and the like;

acid amides ($NR_2$:R=H or alkyl group) such as formamide, N-methyl formamide, N,N-dimethyl formamide, acetoamide, N-methyl acetoamide, N,N-dimethyl acetoamide, tetramethylurea, ε-caprolactam and the like; and heterocyclic compounds such as pyridine, quinoline, pyrrole, piperidine, piperazine, morpholine, 2-pyrrolidinone, 1-methyl-2-pyrrolidinone and the like.

As the organic silicon compound used in the invention, mention may be made of tetraalkoxysilanes (orthosilicic acid esters) such as tetramethoxysilane, tetraethoxysilane, tetra-n-propoxysilane, tetraisopropoxysilane, tetra-n-butoxysilane;

alkylalchoxysilanes such as methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, phenyltrimethoxysilane, dimethyldimethoxysilane, dimethyldiethoxysilane, diethyldimethoxysilane, diethyldiethoxysilane, diethyldi-n-propoxysilane, ethyldiisopropoxysilane, methylvinyldimethoxysilane, methylvinyldiethoxysilane, methyldiethoxysilane, methyldiethoxysilane, dimethylvinylethoxysilane, dimethylvinylethoxysilane;

polysiloxanes such as tetrakis(dimethylsiloxy)silane;

cyclosiloxanes such as octamethylcyclotetrasiloxane, pentamethylcyclotetrasiloxane, tetramethylcyclotetrasiloxane, hexamethylcyclotrisiloxane, trimethylcyclotrisiloxane;

disiloxanes such as hexamethyldisiloxane, tetramethyldimethoxydisiloxane, dimethyltetramethoxydisiloxane, hexamethoxydisiloxane;

alkylsilanes such as monomethylsilane, dimethylsilane, trimethylsilane, tetramethylsilane, tetraethylsilane, triethylsilane, allyltrimethylsilane, hexamethyldisilane;

silylamines such as diethyltrimethylsilylamine, dimethyltrimethylsilylamine;

nitrogen derivatives of silane such as aminopropyltriethoxysilane, trimethylsilylazide, trimethylsilylcyanide;

silazanes such as hexamethyldisilazane, tetramethyldisilazane, octamethylcyclotetrasilazane, hexamethylcyclotrisilazane; and halogenated silanes and their derivatives such as trimethylchlorosilane, triethylchlorosilane, tri-n-propylchlorosilane, methyldichlorosilane, dimethylchlorosilane, chloromethyldimethylchlorosilane, chloromethyltrimethylsilane, chloropropylmethyldichlorosilane, chloropropyltrimethoxysilane, dimethyldichlorosilane, diethyldichlorosilane, methylvinyldichlorosilane, methyltrichlorosilane, ethyltrichlorosilane, vinyltrichlorosilane, trifluoropropyltrichlorosilane, trifluoropropyltrimethoxysilane, trimethylsilyliodide and a mixture thereof. In the mixture, a mixing ratio may be optional.

Further, inorganic silicon compounds such as monosilane and disilane and organic silicon compounds such as SOB, DADBS and SOP may be advantageously used as the raw material for the insulating film.

The treating of the substrate surface prior to the deposition of the insulating film may be performed by any desired process using said organic compound or an aquarious solution of said organic compound or an organic solvent solution of said organic compound. For instance, the spin coating method, spraying method, curtain coating method, and dipping method may be advantageously used in the method according to the invention.

In a preferable embodiment according to the invention, an interlayer insulating film of a semiconductor device is formed by forming a plasma-CVD $SiO_2$ film as an insulating substrate film, treating the surface of the substrate film with ethanol by means of a spin coater, and then depositing AP $O_3$-CVD-$SiO_2$ film by using the atmospheric pressure ozon-TEOS CVD method.

In the method of manufacturing the insulating film of the semiconductor device according to the invention, it is possible to improve the dependency of the CVD insulating film using the organosilicon compound as the raw material upon the substrate surface by simply processing the surface of the substrate by the organic compound or its aquarious solution or its organic solvent solution, and thus the step coverage and planarization of the insulating film can be improved. Further the insulating film is free from undesired voids and cracks, and an amount of gas desorption, particularly the water content is small. In this manner, it is possible to obtain the insulating film having excellent properties. Moreover, the treatment of the substrate surface prior of the deposition of the insulating film is very simple, so that the manufacturing apparatus can be made simple and the throughput can be improved.

A mechanism for improving the step coverage, planarization and the quality of the insulating film could not be understood clearly, but the following mechanism may be considered.

1. Modification of Surface of Insulating Substrate Film through Ethanol Treatment All of $SiH_4$ or TEOS base plasma CVD oxide film or thermal CVD oxide film and thermal oxide film of Si used as an insulating film are amorphous $SiO_2$ or has a composition near to $SiO_2$. An uppermost surface of amorphous $SiO_2$ is easily hydrated by water existent in the process or atmosphere to frequently form a silanol (Si—OH) structure. Thus, Si—OH existing on the surface strongly polarizes in form of $-O^{\delta-}\ldots H^{\delta+}$ as a whole to have a large dipole moment because electrons are attracted toward Si side due to its high electronegativity. Owing to such a polarization, Si—OH strongly adsorbs molecules having high porality such as water or alcohols. A typical example of enhancing the adsorbability of Si—OH to maximum by increasing specific surface area is silica gel as a drying agent.

It is assumed that a gaseous organic compound is blown onto or a liquid organic compound is applied to or immersed in the $SiO_2$ insulating film covered at its surface with Si—OH. Many organic compounds are adsorbed on the surface by polarization action of Si—OH, but the adsorbing strength is dependent upon the polarity of the organic compound. A non-polar substance such as cyclohexane, benzene or the like is hardly adsorbed on the surface, while a high-polarity substance such as lower alcohol, acetonitrile, lower carboxylic acid or the like is strongly adsorbed. It is anticipated that dioxane, ketone and the like having a middle polarity are adsorbed at a middle strength.

On the other hand, Si—OH acts as Lewis acid discharging proton and interacts with another organic substance having an active hydroxyl group. As a typical example, there is an exchange reaction with alkoxyl group of alcohol. For example, an esterification reaction of Si—OH+$C_2H_5$OH= Si—$OC_2H_5$+$H_2O$ in case of ethanol ($C_2H_5OH$). The thus formed bond of Si—$OC_2H_5$ is very strong, so that Si—$OC_2H_5$ formed on spontaneous oxide film of Si has a life of not less than several ten minutes even in an oxidizing atmosphere of 400° C.

Therefore, it is considered that the vapor or liquid treatment with the organic compound creates the chemical adsorption of molecules of the organic compound and also the esterification reaction is caused by the treatment with an alcohol such as ethanol or the like. In any case, the adsorbed or esterified silanol loses an adsorbability and finally changes into an inactivated surface state.

Upon evaluating a degree of adsorbability on the surface of the insulating film, a desorption temperature of absorbed chemical species is a measure, which has generally the same tendency as in the polarity of the chemical species. Particularly, the alcohol causing the esterification reaction shows a high desorption temperature.

2. Vapor Phase Chemical Reaction of $O_3$-TEOS and Film-Forming Chemical Species in Vapor Phase In thermal CVD reaction of $O_3$-TEOS, it is considered that two intermediate chemical substances contributing to a film formation (film-forming chemical species) are existent in the vapor phase. One of the above two intermediates is a silanol (A): HO—Si$(OC_2H_5)_3$ and is considered to be produced by the following chemical reaction formula (1) of TEOS $(Si(OC_2H_5)_4)$ and atomic oxygen O. Moreover, TEOS does not directly react with $O_3$, so that the reaction is considered to start from the atomic oxygen O produced by thermal decomposition of $O_3$.

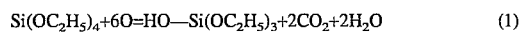

$$Si(OC_2H_5)_4+6O=HO—Si(OC_2H_5)_3+2CO_2+2H_2O \qquad (1)$$

That is, ethoxy group bonded to Si is decomposed by oxidation through oxygen atom to leave silanol. In the formula (1), final oxide product is $CO_2$ and $H_2O$, but it is actually considered that ethanol ($C_2H_5OH$), methanol ($CH_3OH$), acetaldehyde ($CH_3CHO$), formaldehyde (HCHO), acetic acid ($CH_3COOH$), formic acid (HCOOH) and the like are produced at an intermediate reaction stage.

The other intermediate is a siloxane polymer (B): $(C_2H_5O)_3$—Si—O—Si$(OC_2H_5)_3$. This polymer is considered to be formed by polycondensation of the silanol (A) produced in the formula (1) according to the following reaction formula (2) or (2').

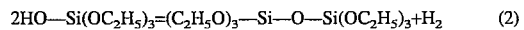
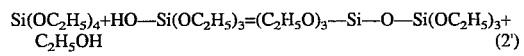

$$2HO—Si(OC_2H_5)_3=(C_2H_5O)_3—Si—O—Si(OC_2H_5)_3+H_2 \qquad (2)$$

$$Si(OC_2H_5)_4+HO—Si(OC_2H_5)_3=(C_2H_5O)_3—Si—O—Si(OC_2H_5)_3+ \\ C_2H_5OH \qquad (2')$$

Since the life of silanol in vapor phase is generally short, it is considered that the silanol (A) is relatively short in the life and easily changes into the siloxane polymer (B) according to the polycondensation reaction of (2), (2') or the like as follows:

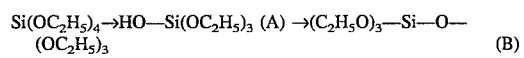

$$Si(OC_2H_5)_4 \rightarrow HO—Si(OC_2H_5)_3 \text{ (A) } \rightarrow (C_2H_5O)_3—Si—O—(OC_2H_5)_3 \qquad (B)$$

Since the silanol (A) has an active Si—OH group in its molecule, it is highly active and polymerizable. Further, it is large in the polarization in molecule and is liable to be adsorbed on the surface of the substrate. On the other hand, the siloxane polymer (B) is low in the activity and has a high boiling point and a low vapor pressure, so that there is a high possibility that the polymer is liquid at an approximately film-forming temperature. Further, the polymer is small in the polarization and it is difficult to cause the adsorption.

When the silanol (A) mainly contributes to the film formation, it is considered that the adsorption of the silanol (A) on the surface of the substrate rapidly occurs and then polysilanol ($Si(OH)_n$, n>1) is formed by oxidation of remaining ethoxy group after the adsorption with ozone and the resulting silanol renders into a new adsorption site, on which the film-forming species (A) in vapor phase is again adsorbed (adsorption-decomposition mechanism). Since the silanol (A) is active in the reaction, the life time is short and the sticking coefficient becomes large, so that the adsorption onto a site to be fed with the silanol (A) immediately occurs and the step coverage is degraded. Moreover, the probability of retaining the silanol in the film as it rises, so that the film quality and the uniformity thereof are relatively poor and the amount of water adsorbed on the surface tends to increase.

On the contrary, when the siloxane polymer (B) mainly contributes to the film formation, it is considered that it is difficult to cause the adsorption and the diffusion (fluidization) of the polymer into the substrate surface through interfacial tension controls the film formation. Although the polymer diffused on the surface is again subjected to silanol formation and polymerization through ozone oxidation, it is considered that since the density of free silanol appearing on the surface is small, the film-forming species (B) in vapor phase is again deposited by fluidization (polymerization-fluidization mechanism). Since the life time of the polymer (B) is long, the step coverage is high and the polymer changes into a flow-like shape. Further, silanol remaining in the surface and interior of the film is reduced, so that the film quality is relatively good.

Even in the contribution of either intermediate (A) or (B), the chemical species deposited by heat or excessive ozone is finally decomposed and oxidized to form a network of Si—O—Si, which approaches to amorphous $SiO_2$ near to stoichiometric ratio. In this case, however, the film formation is not conducted only by one of the intermediates (A) and (B), but is always conducted by the two chemical species (A) and (B), and it is considered that the balance between the chemical species (A) and (B) contributing to the film formation changes in accordance with film-forming parameters such as ozone concentration, film-forming temperature and the like and the surface state of the substrate.

3. Relation between Surface State of Substrate and Vapor Phase Chemical Reaction As seen from the aforementioned film formation mechanism, the shape after the film formation is largely influenced by the balance between the film-forming chemical species in vapor phase.

When the Si—OH adsorption site is distributed on the substrate at a high density, the silanol (A) among the chemical species in vapor phase is immediately adsorbed on the substrate surface before the polymerization because the polarity is large. The adsorbed silanol is immediately subjected to oxidation through ozone or heat to form silanol capable of forming a new adsorption site, or is added with another silanol (A), whereby the film deposition through the adsorption-decomposition mechanism contributed by the silanol (A) continuously proceeds. And also, it is considered that the deposition by the siloxane polymer (B) is caused at a small ratio accompanied with the deposition by the silanol (A). Therefore, there is a possibility that the local variation of the film quality due to the presence of the two film-forming species occurs to result in the occurrence of unevenness in the etching with BHF. The film-forming mechanism of $O_3$-TEOS on the oxide film not treated with ethanol corresponds to this type.

When the insulating substrate film is treated with the organic compound to kill active silanol having an adsorbability as in the invention, the silanol (A) is not adsorbed on the substrate. As a result, the residence time in vapor phase is prolonged to raise the probability of changing into the siloxane polymer (B), and the ratio of the siloxane polymer (B) in the film-forming chemical species in vapor phase becomes higher. The siloxane polymer (B) is diffused so as to cover the substrate surface through interfacial tension. Since the siloxane polymer (B) has no active silanol, once the film surface is covered with the siloxane polymer (B), the silanol (A) is not adsorbed and the subsequent deposition is mainly conducted by the fluidization of the siloxane polymer (B).

In other words, the state of the substrate before the film formation can have a decisive influence on the subsequent film-forming mechanism to the last. The preliminary treatment with the organic compound is considered to be most suitable according to a guess from the above film-forming mechanism that when the organic compound is adsorbed on all of active adsorption sites, the complete effect is obtained and any organic compounds not desorbed at a film-forming temperature of about 400° C. may be used, while acetonitrile having a high polarity and lower alcohol having an esterification action are not desorbed at the film-forming temperature and stably restrain in the film formation.

Moreover, in the most initial stage that the siloxane polymer (B) is fluidized through interfacial tension, there is a high possibility that the absolute value of interfacial tension between siloxane polymer and substrate surface influences the final flow shape. That is, the wetting between siloxane polymer and treated substrate must be adjusted, so that it is desirable that in order to obtain a good flow shape, the chemical species well wetted to the siloxane polymer is adsorbed or esterified by the treatment with the organic compound. This is guessed from an experimental confirmation that preferable results are obtained by the treatment with ethanol or 2-ethoxyethanol having the same functional group as the siloxane polymer.

The above is based on theory and experimental result, but is a deduction to the end. Of course, the technical scope of the invention is not limited by such a deduction.

As the treatment of the substrate surface with the organic compound, there are a spin-coat treatment in which the organic compound is applied while spinning a semiconductor wafer (coating treatment), a vapor treatment in which a vapor of an organic compound is blown onto a semiconductor wafer, an immersion treatment in which a semiconductor wafer is immersed in a solution of an organic compound, a spray treatment in which a solution of an organic compound is sprayed onto a semiconductor wafer, a curtain flow coat treatment in which a semiconductor substrate is passed through a down flow stream of an organic compound, and the like. All of these treatments may be carried out simply.

BRIEF DESCRIPTION OF THE DRAWINGS

FIG. 1 is a schematic view showing an embodiment of the CVD reactor for carrying out the chemical vapor deposition;

FIG. 2 is a cross sectional view illustrating the construction of the semiconductor device manufactured by a first embodiment of the method according to the invention;

FIG. 3 is a schematic view of a semiconductor device manufactured by a first comparative method;

FIG. 4 is a cross sectional view depicting the construction of the semiconductor device manufactured by a second embodiment of the method according to the invention;

FIG. 5 is a cross sectional view showing the construction of the semiconductor device formed by a second comparative method;

FIG. 6 is a schematic diagram illustrating an embodiment of an apparatus for effecting the surface treatment according to the invention;

FIGS. 7A and 7B are cross sectional views showing successive steps of an embodiment of the method according to the invention;

FIG. 8 is a cross sectional view depicting the semiconductor device manufactured by a comparative method;

FIGS. 9A and 9B are cross sectional views showing a modification of the embodiment illustrated in FIGS. 7A and 7B;

FIG. 10 is a cross sectional view representing a semiconductor device formed by an embodiment of the method according to the invention;

FIG. 11 is a cross sectional view illustrating a semiconductor device manufactured by a comparative method;

FIG. 12 is a cross sectional view representing a semiconductor device formed by an embodiment of the method according to the invention;

FIG. 13 is a cross sectional view showing a semiconductor device manufactured by another embodiment of the method according to the invention;

FIG. 14 is a cross sectional view depicting a semiconductor device formed by another embodiment of the method according to the invention;

FIG. 15 is a cross sectional view illustrating a semiconductor device manufactured by another embodiment of the method according to the invention;

FIG. 16 is a schematic view showing an embodiment of an apparatus for treating the substrate surface according to the invention;

FIG. 17 is a schematic view depicting another embodiment of the apparatus for treating the substrate surface according to the invention;

FIG. 18 is a schematic view illustrating still another embodiment of the apparatus for treating the substrate surface according to the invention;

FIGS. 21A, 21B and 21C are cross sectional views showing successive steps of another embodiment of the method according to the invention;

FIGS. 22A, 22B and 22C are schematic cross sectional views illustrating steps of another embodiment of the method according to the invention;

FIG. 23 is a cross sectional view showing still another embodiment of the method according to the invention;

FIG. 24 is a schematic view illustrating a plasma CVD apparatus in which the surface treatment is conducted;

DESCRIPTION OF THE PREFERRED EMBODIMENTS

Figure 19:
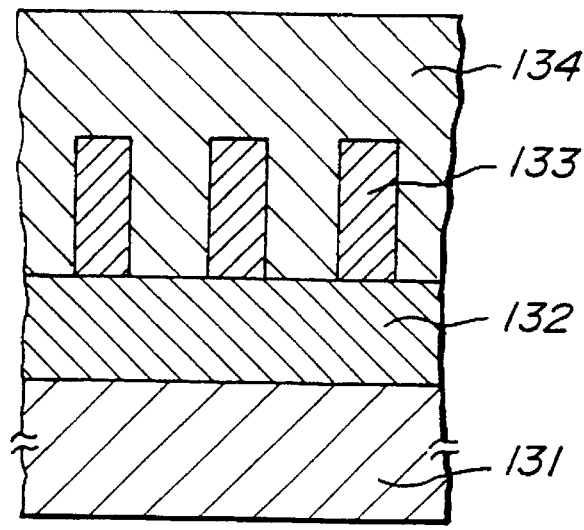
FIGS. 19 is a schematic view showing another embodiment of the method according to the invention.

FIG. 1 is a schematic view showing an embodiment of a chemical vapor deposition reactor which is used for carrying out various embodiments of the method according to the invention and the chemical vapor deposition is performed by using various kinds of organic silicon compounds. The apparatus comprises a reaction chamber 1 and an electric heater 2 for heating a silicon wafer 4 supported by a susceptor 3. Outside the reaction chamber 1 are provided an ozonizer 5 and a thermostat 6 in which a gas bubbler 7 is arranged. To the ozonizer 5 is supplied an oxygen gas, so that the oxygen gas containing an ozone gas is produced. An ozone concentration may be varied over a wide range, and in the present embodiment, the oxygen gas including the ozone by the ozone concentration of 5.0% is produced as the reaction gas. An organic silane such as TEOS and TMOS is contained in the gas bubbler 7 arranged in the thermostat 6 and a nitrogen gas is supplied into the gas bubbler at a given rate so that an organic silane gas is generated. The thus generated organic silane gas is supplied to the reaction chamber 1 together with the ozone containing oxygen gas generated by the ozonizer 5 with the aid of a carrier gas. In the present embodiment, the carrier gas is formed by the nitrogen gas. Within the reaction chamber 1, there is further provided a dispersion head 8 so that the mixture of the ozone containing oxygen gas and organic silane gas is blown against the surface of the semiconductor wafer as a laminating flow. In this manner, the insulating film can be formed uniformly over the whole surface of the silicon wafer. To this end, the silicon wafer 4 is swung laterally in the plane of the silicon wafer together with the heater 2 and susceptor 3.

Embodiment 1

As illustrated in FIG. 2, on a silicon substrate 11 there is formed a BPSG (borophosphosilicate glass) film 12 having a thickness of 6000Å, and on the BPSG film there is formed an aluminum wiring 13 having a height of 1 μm, line width of 0.5 μm and a space width of 0.5 μm. It should be noted that under the BPSG film 12, there is arranged a first conductive material wiring usually made of doped-polysilicon, so that the BPSG film serves as the primary insulating film. On the BPSG film 12 and aluminum wiring 13 there is formed a plasma-TEOS CVD NSG (non-doped silicate glass) film 14 having a thickness of 3000Å. This plasma-TEOS CVD NSG film 14 is formed by the following conditions:

deposition temperature: 350° C.
deposition pressure: 2.2 Torr
deposition time: 20 sec
TEOS supply rate: 1.8 ml/min
oxygen gas supply rate: 4.0 l/min (SML—Standard Liters per Minute)
RF power: 1 KW (400 KHz, 500 W; 13.56 MHz, 500 W)

A thickness of the plasma-TEOS CVD NSG film 14 is 3000Å on the aluminum wiring 13, but is only about 1000Å on side walls of the aluminum wiring.

Next, a surface of the silicon wafer is treated by ethanol. In the present embodiment, the silicon wafer is placed on a spin coater and then the spin coater is rotated at 1000 rpm. Then, the ethanol is applied onto the surface of the silicon wafer for ten seconds at a flow rate of 100 ml/min. After stopping the supply of the ethanol, the rotational speed of the spin coater is increased up to 2000 rpm and the silicon wafer is dried for 60 seconds.

Next, the silicon wafer is fed into the reaction chamber 1 shown in FIG. 1, and an ozone-TEOS CVD NSG film 15 having a thickness of 10000Å is formed under the following conditions. In the present embodiment, this ozone-TEOS CVD NSG film 15 serves as a first interlayer insulating film.
deposition temperature: 400° C.
deposition pressure: atmospheric pressure
deposition time: 545 seconds
nitrogen supply rate to gas bubbler: 1.5 l/min
temperature of thermostat: 65° C.
oxygen supply rate to ozonizer: 7.5 l/min
ozone concentration: 5 weight %
supply rate of carrier nitrogen: 18 l/min It should be noted that the ozone concentration of 5 weight percentages corresponds to about 110 gr/m$^3$. The thus formed AP ozone-TEOS CVD NSG film 15 has an excellent step coverage and very narrow spaces between successive lines of the aluminum wiring 13 can be sufficiently filled with the ozone-TEOS CVD NSG material. Moreover, the flatness of the ozone-TEOS CVD NSG film 15 is also improved. Further, the ozone-TEOS CVD NSG film 15 has no void formed therein and has an excellent property.

Comparative Example 1

As shown in FIG. 3, on a silicon substrate 11 there is formed a BPSG film 12 having a thickness of 6000Å and on the BPSG film is formed an aluminum wiring 13. Then, a plasma-TEOS CVD film 14 having a thickness of 3000Å is formed. The steps so far explained are entirely same as the corresponding steps in the above mentioned embodiment 1, so that the aluminum wiring 13 has a height of 1 μm, a line width of 0.5 μm and a space width of 0.5 μm. Next, the silicon wafer is placed in the reaction chamber without treating its surface with the ethanol. Then, the ozone-TEOS CVD NSG film 16 having the thickness of 10000Å is deposited on the silicon wafer under the same conditions as those of the embodiment 1. In this comparative example 1, the spaces between successive lines of the aluminum wiring 13 are not filled with the ozone-TEOS CVD NSG material and many large voids 17 are formed within the ozone-TEOS CVD NSG film 16.

Embodiment 2

As depicted in FIG. 4, on a surface of a silicon substrate 21 is formed a BPSG film 22, and then an aluminum wiring 23 having a thickness of 1 μm, a line width of 0.5 μm and a space width of 0.5 μm is formed on the BPSG film 22. On the aluminum wiring 23 there is further formed a titanium nitride (TiN) film 24 having a thickness of 500Å.

Next, after the surface of the silicon wafer has been processed by the ethanol in the same manner as the embodiment 1, the silicon wafer is introduced into the reaction chamber 1 shown in FIG. 1, and an AP ozone-TEOS CVD NSG film 25 having a thickness of 10000Å is formed on the silicon surface under the same conditions as those of the embodiment 1. As depicted in FIG. 4, the ozone-TEOS CVD NSG film 25 has excellent step coverage and planarization, and further any void is formed within the film.

Comparative Example 2

As shown in FIG. 5, a BPSG film 22 is formed on a silicon substrate 21, an aluminum wiring 23 is formed on the BPSG film 22, and a TiN film 24 is formed on the aluminum wiring 23. Then, without treating the silicon wafer surface with the ethanol, the silicon wafer is fed into the reaction chamber and an ozone-TEOS CVD NSG film 26 having the thickness of 10000Å is deposited on the silicon wafer. The ozone-TEOS NSG film 26 has a number of voids 27 formed therein. It should be noted that these voids might deteriorate the property of semiconductor devices formed in this silicon wafer.

The ozone-TEOS CVD NSG films formed by the above mentioned embodiments 1 and 2 and comparative examples 1 and 2 were estimated by means of a thermal desorption spectroscopy (TDS) estimating device. In the TDS estimating device, gases which are desorbed from the silicon wafer upon heating are analyzed by means of a quadropole mass spectrometry (Q-Mass). That is to say, the silicon wafer is introduced in an estimating room and the inside the estimating room is evacuated up to a degree of vacuum of $10^{-9}$ Torr. Next, the silicon wafer is heated from the room temperature to 500° C. for 30 minutes. During this heating, gases are desorbed from silicon wafer and the thus desorbed gases are introduced into the Q-Mass to estimate the desorbed gases.

By utilizing the above mentioned TDS estimating device, gases, particularly water (mass number 18) desorbed from the ozone-TEOS CVD NSG films are analyzed. Then, it has been experimentally confirmed that the ozone-TEOS CVD NSG films formed by the above mentioned embodiments 1 and 2 of the method according to the invention did scarcely desorb or emit the water, but an amount of desorbed water from the ozone-TEOS CVD NSG films formed by the comparative examples 1 and 2 was larger than that of the embodiments 1 and 2 by at least one order.

Embodiment 3

Similar to the embodiment 1 shown in FIG. 2, a BPSG film 12 having a thickness of 6000Å is formed on a silicon substrate 11, and an aluminum wiring 13 having a height of 1 μm, a line width of 0.5 μm and a space width of 0.5 μm is selectively formed on the BPSG film 12. Then, a plasma-CVD NSG film 14 is formed on the BPSG film 12 and aluminum wiring 13 under the same conditions as those of the embodiment 1. On the aluminum wiring 23 the plasma-CVD film 14 has a thickness of 3000Å, but on the side walls of the aluminum wiring, the plasma-CVD film 14 has a thickness of about 1500Å.

Next, after the surface of the silicon wafer, i.e. a surface of the plasma-CVD film 14 is treated by methanol. In the present embodiment, the silicon wafer is placed on the spin coater and is rotated at 1000 rpm. During the rotation, the methanol is supplied at a flow rate of 100 ml/min for five seconds, and after stopping the supply of the methanol, the rotation speed is increased up to 200 rpm and the silicon wafer is dried for sixty seconds.

After that, the silicon wafer is transported into the reaction chamber illustrated in FIG. 1. In the present embodiment, TMOS is contained in the gas bubbler and an ozone-TMOS CVD NSG film having a thickness of 8000Å is deposited on the silicon wafer under the following conditions:
deposition temperature: 400° C.
deposition pressure: atmospheric pressure
deposition time: 360 seconds
nitrogen supply rate to gas bubbler: 1.5 l/min
temperature of thermostat: 65° C.
oxygen supply rate to ozonizer: 7.5 l/min
ozone concentration: 5 weight %
supply rate of carrier nitrogen: 18 l/min It has been experimentally confirmed that very narrow spaces between successive lines of the aluminum wiring 13 are sufficiently filled with the ozone-TMOS CVD NSG material and no void is formed within the ozone-TMOS CVD NSG film 15. Further, the surface of the ozone-TMOS CVD NSG film is highly planarized.

Comparative Example 3

In this comparative example 3, similar to the comparative example 1 shown in FIG. 3, a BPSG film 12 having the thickness of 6000Å is formed on a silicon substrate 11, and an aluminum wiring 13 having a height of 1 μm, a line width of 0.5 μm and a space width of 0.5 μm is formed on the BPSG film 12. Then, a plasma-CVD NSG film 14 is formed on an exposed portion of the BPSG film 12 and the aluminum wiring 13 under the same condition as those of the embodiment 3. Next, the silicon wafer is fed into the reaction chamber without performing the methanol treatment for the surface of the plasma-TEOS CVD NSG film 14, and an ozone-TMOS CVD NSG film having a thickness of 8000Å is deposited on the silicon wafer under the following conditions:
deposition temperature: 400° C.
deposition pressure: atmospheric pressure
deposition time: 545 seconds
nitrogen supply rate to gas bubbler: 1.5 l/min
temperature of thermostat: 65° C.
oxygen supply rate to ozonizer: 7.5 l/min
ozone concentration: 5 weight %
supply rate of carrier nitrogen: 18 l/min In this comparative example 3, spaces between successive lines of the aluminum wiring 13 are not completely filled with the ozone-TMOS CVD NSG material and many voids are formed in the ozone-TMOS CVD NSG film.

The ozone-TMOS CVD NSG films formed by the above explained embodiment 3 and comparative example 3 are tested by using the above mentioned TDS estimating device. It has been experimentally confirmed that the water was scarcely desorbed from the ozone-TMOS CVD NSG film of the embodiment 3, but a large amount of the water has been desorbed from the ozone-TMOS CVD NSG film of the comparative example 3.

Embodiment 4

In this embodiment 4, use is made of 1% ethanol cyclohexane solution for treating the surface of the silicon wafer. That is to say, the ethanol is used as the organic compound of OH group and is added to the cyclohexane serving as the organic solvent at a volume ratio of 1:99.

Similar to the embodiment 1 shown in FIG. 2, after the first conductive material pattern made of polysilicon has been formed on a silicon substrate 11, a BPSG film 12 having a thickness of 6000Å is formed on the silicon substrate and then an aluminum wiring 13 having a height of 1 μm is formed on the BPSG film 12 such that a line width is 0.5 μm and a space width is 0.5 μm. Next, a plasma-TEOS CVD NSG film 14 having a thickness of 3000Å is formed on an exposed portion of the BPSG film 12 as well as on the aluminum wiring 13 under the same conditions as those of the embodiment 1. Then, the surface of the silicon wafer is treated by the 1% ethanol cyclohexane solution by means of the spin coater. After that, an ozone-TEOS CVD NSG film 15 having a thickness of 1 μm is deposited on the silicon wafer under the same conditions as those of the embodiment 1. Also in the present embodiment 4, it is possible to obtain the ozone-TEOS CVD NSG film 15 having the high conformal step coverage and planarization capability for very narrow spaces between successive lines of the aluminum wiring 13. Moreover, an amount of desorbed gases from the ozone-TEOS CVD NSG film is very small and any void is not formed within the film.

Embodiment 5

In this embodiment 5, acetonitrile of CN group is used as the organic compound for the substrate surface treatment. The acetonitrile is added to a tetrahydrofuran (THF) serving as an organic solvent at a volume ratio of 1:99 to obtain an 1% acetonitrile THF solution.

Similar to the embodiment shown in FIG. 2, a BPSG film 12 having a thickness of 6000Å is formed on a silicon substrate 11 and then an aluminum wiring 13 having a height of 1 μm is formed on the BPSG film 12 such that a line width is 0.5 μm and a space width is 0.5 μm. Next, a plasma-TEOS CVD NSG film 14 having a thickness of 3000Å is formed on the BPSG film 12 as well as on the aluminum wiring 13 under the same conditions as those of the embodiment 1. Then, the surface of the silicon wafer is treated by the 1% acetonitrile THF solution by means of the spin coater. After that, an ozone-OMCTS CVD NSG film having a thickness of 1 μm is formed on the silicon wafer under similar conditions to those of the embodiment 1. In the present embodiment, OMCTS is contained in the gas bubbler 7 and the temperature of the thermostat 6 is set to 75° C. The remaining depositing conditions are entirely same as those of the first embodiment. Also in the present embodiment 4, it is possible to obtain the ozone-OMCTS CVD NSG film having an excellent property. That is to say, narrow spaces between successive lines of the aluminum wiring 13 are sufficiently filled with the ozone-OMCTS CVD NSG material and any void is not formed within the ozone-OMCTS CVD NSG film.

Embodiment 6

In the present embodiment 6, use is made of nitromethane of $NO_2$ group as the organic compound for the substrate surface treatment.

Similar to the embodiment shown in FIG. 2, a BPSG film 12 having a thickness of 6000Å is formed on a silicon substrate 11 and then an aluminum wiring 13 having a height of 1 μm, a line width of 0.5 μm and a space width of 0.5 μm is formed on the BPSG film 12. Next, a plasma-TEOS CVD NSG film 14 having a thickness of 3000Å is formed on the BPSG film 12 as well as on the aluminum wiring 13 under the same conditions as those of the embodiment 1. Then, the surface of the silicon wafer is treated by the nitromethane by means of the spin coater. Next, an ozone-TEOS CVD NSG film having a thickness of 1 μm is formed on the silicon wafer under the same conditions as those of the embodiment 1. Also in the present embodiment 5, the ozone-TEOS CVD NSG film having an excellent property can be formed such that narrow spaces between successive lines of the aluminum wiring 13 are sufficiently filled with the ozone-TEOS CVD NSG material and no void is formed within the ozone-TEOS CVD NSG film.

Embodiment 7

In the present embodiment 7, a formic acid of CO group is used as the organic compound for the substrate surface treatment.

Like as the first embodiment 1 shown in FIG. 2, a BPSG film 12 having a thickness of 6000Å is formed on a silicon substrate 11 and then an aluminum wiring 13 having a height of 1 μm, a line width of 0.5 μm and a space width of 0.5 μm is formed on the BPSG film 12. Next, a plasma-TEOS CVD NSG film 14 having a thickness of 3000Å is formed on the BPSG film 12 as well as on the aluminum wiring 13 under the same conditions as those of the embodiment 1. After the surface of the silicon wafer has been treated by the formic acid by means of the spin coater, the silicon wafer is fed into the reaction chamber and an ozone-TEOS CVD NSG film having a thickness of 1 μm is formed on the silicon wafer under the same conditions as those of the embodiment 1. The ozone-TEOS CVD NSG film having an excellent property can be formed also in the present embodiment 7, and very narrow spaces between successive lines of the aluminum wiring 13 are sufficiently filled with the ozone-TEOS CVD NSG material and any void is not formed within the ozone-TEOS CVD NSG film.

Embodiment 8

In this embodiment 8, pyridine of heterocyclic compound is used as the organic compound for the substrate surface treatment. The pyridine is added to a benzene solvent at a volume ratio of 1:1 to obtain a 50% pyridine benzene solution.

Similar to the embodiment 1 illustrated in FIG. 2, a BPSG film 12 having a thickness of 6000Å is formed on a silicon substrate 11 and then an aluminum wiring 13 having a height of 1 μm, a line width of 0.5 μm and a space width of 0.5 μm is formed on the BPSG film 12. Then, a plasma-TEOS CVD NSG film 14 having a thickness of 3000Å is formed on the BPSG film 12 under the same conditions as those of the embodiment 1. After the surface of the silicon wafer has been treated by the 50% pyridine benzene solution by means of the spin coater, the silicon wafer is fed into the reaction chamber shown in FIG. 1 and an ozone-TEOS CVD NSG film having a thickness of 1 μm is formed on the silicon wafer under the same conditions as those of the embodiment 1. Also in the present embodiment 8, the ozone-TEOS CVD NSG film having an excellent property can be formed such that very narrow spaces between successive lines of the aluminum wiring 13 are sufficiently filled with the ozone-TEOS CVD NSG material and no void is formed within the ozone-TEOS CVD NSG film.

Embodiment 9

In the present embodiment 9, the surface treatment using the ethanol is performed by the dipping method.

Similar to the embodiment illustrated in FIG. 2, a BPSG film 12 having a thickness of 6000Å is formed on a silicon substrate 11 and then an aluminum wiring 13 having a height of 1 μm is formed on the BPSG film 12 such that a line width is 0.5 μm and a space width is 0.5 μm. Then, a plasma-TEOS CVD NSG film 14 having a thickness of 3000Å is formed on the BPSG film 12 and aluminum wiring 13 under the same conditions as those of the embodiment 1. Then, the ethanol of ten litters is contained in a vessel and the silicon wafer is dipped or immersed into the ethanol for one minute. After the silicon wafer is drawn out of the ethanol, it is dried by a spin drier for 5 minutes. Then, the silicon wafer is fed into the reaction chamber shown in FIG. 1 and an ozone-TEOS CVD NSG film having a thickness of 1 μm is formed on the silicon wafer under the same conditions as those of the embodiment 1. Also in the present embodiment 9, the ozone-TEOS CVD NSG film having an excellent property can be formed and narrow spaces between successive lines of the aluminum wiring 13 are sufficiently filled with the ozone-TEOS CVD NSG material and no void is formed within the ozone-TEOS CVD NSG film.

Embodiment 10

In this embodiment 10, the substrate surface treatment using the ethanol is carried out by the vapor exposing method.

Similar to the embodiment illustrated in FIG. 2, a BPSG film 12 having a thickness of 6000Å is formed on a silicon substrate 11 and then an aluminum wiring 13 having a height of 1 μm is formed on the BPSG film 12 such that a line width is 0.5 μm and a space width is 0.5 μm. Then, a plasma-TEOS CVD NSG film 14 having a thickness of 3000Å is formed on the BPSG film 12 and aluminum wiring 13 under the same conditions as those of the embodiment 1. Then, the silicon wafer is subjected to the ethanol vapor exposure in the following manner.

FIG. 6 is a schematic view showing an embodiment of an apparatus for performing the ethanol vapor exposure. As illustrated in FIG. 6, into a bottom of a vessel 31 made of quartz is introduced the ethanol by means of a pipe 32 and the thus introduced ethanol is heated to 100° C. by heaters 33 arranged under the bottom and a lower portion of the vessel, respectively. At an upper portion of the vessel 31 there is arranged a cooling coil 34 for recovering the ethanol. To the bottom of the vessel 31 is connected a drain pipe 35 for recovering the ethanol. To a top portion of the vessel 31 is connected a pipe 36 for exhaust. There are further provided water drain pipes 37.

The heaters 33 are heated to 78.5° C. and the ethanol is evaporated, so that the vessel 31 is filled with the ethanol vapor. Twenty five silicon wafers are set in a cassette and the cassette is introduced into the vessel 31. Then, the silicon wafers are subjected to the vapor of the ethanol for five minutes. In this case, the recesses having a large aspect ratio in the silicon wafer is sufficiently filled with the ethanol vapor. To this end, it is preferable that a concentration of the ethanol vapor is higher than 25% LEL. After that, the nitrogen gas is supplied to the vessel 31 at a flow rate of 5 l/min to increase a partial pressure of the nitrogen gas up to 3 Kg/cm$^2$, and the silicon wafers are dried for ten minutes.

As explained above, the silicon wafers are exposed to the ethanol vapor for five minutes and then are dried for ten minutes. Then, the silicon wafer is transported into the reaction chamber shown in FIG. 1 and an ozone-TEOS CVD NSG film having a thickness of 1 μm is deposited on the silicon wafer under the same conditions as those of the embodiment 1. Also in the present embodiment 10, the ozone-TEOS CVD NSG film having an excellent property can be formed and narrow spaces between successive lines of the aluminum wiring 13 are effectively filled with the ozone-TEOS CVD NSG material and any void is not formed within the ozone-TEOS CVD NSG film.

In the embodiments so far explained, the ozone-TEOS, -TMOS and -OMCTS CVD NSG films are formed by the atmospheric pressure CVD method, but according to the invention, these insulating films may be formed by any other CVD methods such as low pressure CVD method, sub-atmospheric pressure CVD method, increased pressure CVD method, plasma CVD method and photochemical CVD method.

Further, in the above embodiments, the first interlayer insulating films provided between the first and second conductive material wiring layers are formed, but according to the invention, it is possible to form the primary insulating film between the semiconductor substrate and the first conductive material pattern layer or the final passivation film. Moreover, insulating side walls provided on side wall surfaces of metal or polysilicon film may be formed by the method according to the invention.

Embodiment 11

In this embodiment 11, an insulating side wall is formed on a side of a gate electrode of a field effect transistor.

As illustrated in FIG. 7A, a gate oxide film 42 having a thickness of 300Å is formed on a silicon substrate 41, and then a gate electrode 43 made of polysilicon is formed on the gate oxide film. This gate electrode 43 serves as the first conductive material layer mentioned above. Next, surfaces of an exposed portion of the gate oxide film 42 and the gate electrode 43 are treated by the ethanol. That is to say, the silicon wafer is placed on a spin coater and is rotated at 2000 rpm. During the rotation, the ethanol is applied onto the silicon wafer surface at a flow rate of 1 ml/sec for three seconds. After the supply of the ethanol is stopped, the silicon wafer is continued to be rotated for forty seconds for drying.

Then, the silicon wafer is transported into the reaction chamber shown in FIG. 1 and an ozone-TEOS CVD NSG film 44 is formed by the deposition of the atmospheric pressure ozone-TEOS CVD NSG material under the following conditions.

deposition temperature: 400° C.
deposition pressure: atmospheric pressure
deposition time: 360 seconds
nitrogen supply rate to gas bubbler: 1.5 l/min
temperature of thermostat: 65° C.
oxygen supply rate to ozonizer: 7.5 l/min
ozone concentration: 5 weight %
supply rate of carrier nitrogen: 18 l/min Next, the ozone-TEOS CVD NSG film 44 thus deposited is etched back over its whole surface to form side walls 45 only on side surfaces of the gate electrode 43 as depicted in FIG. 7B.

It has been experimentally confirmed that the side wall 45 formed by the above method including the surface treatment has an excellent property and no void is formed therein. Further, an amount of gases including the water desorbed from the side wall is smaller than that of a comparative example 4 to be explained later by at least one order. Since the ozone-TEOS CVD NSG film 44 thus obtained can be etched easily and precisely, the side wall 45 having a good configuration can be formed by etching. Therefore, the ozone-TEOS CVD NSG film 44 can have a smaller thickness, and therefore a necessary time for etching can be shortened and the etching damage can be reduced.

Comparative Example 4

As shown in FIG. 8, a gate oxide film 42 is formed on a silicon substrate 41 and a gate electrode 43 made of polysilicon is formed on the gate oxide film. In this comparative example 4, the silicon wafer is transported into the reaction chamber without performing the surface treatment using the organic compound. Then, an atmospheric ozone-TEOS CVD NSG film having a thickness of 6000Å is deposited on the silicon wafer, and the thus deposited film is etched back over its whole surface to form a side wall 46 on a side wall surface of the gate electrode 43. As illustrated in FIG. 9, many voids 47 are formed in the side wall 46. Further, it has been experimentally confirmed by the TDS estimating device that a large amount of gases including the water is evolved from the side wall 46.

The inventors have conducted various experiments for estimating the throughput, uniformity of the side wall, etching rate for BHF enchant (10:1), uniformity for etching, shape and total estimation of the side walls manufactured by the method according to the invention and comparative example methods. The results of these tests may be summarized in the following table:

In this table, a novel method No. 1 denotes the method according to the invention in which the atmospheric pressure ozone-TEOS CVD NSG side wall is formed, and a novel method No. 2 represents the method according to the invention in which the ozone-TEOS CVD NSG side wall is formed by the low pressure ozone-TEOS CVD. A known method No. 1 denotes a method in which the side wall is formed by the low pressure CVD using SiH$_4$, a known method No. 2 corresponds to the above explained comparative example 4 in which the side wall is formed by the atmospheric pressure ozone-TEOS CVD, and a known method No. 3 represents a method in which a side wall is formed by a low pressure ozone-TEOS CVD. It should be noted that in the known methods Nos. 1, 2 and 3, the substrate surface treatment using the organic compound is not performed prior to the deposition of the insulating film.

|  | Novel method 1 | Novel method 2 | Known method 1 | Known method 2 | Known method 3 |
| --- | --- | --- | --- | --- | --- |
| Throughput | 2.5 hours | 4.5 hours | 5 hours | 2 hours | 4 hours |
| Uniformity in thickness | within wafer 3% between wafer 4% | within wafer 4% between wafer 5% | within wafer 8% between wafer 10% | within wafer 8% between wafer 10% | within wafer 8% between wafer 10% |
| Etching rate | 2000 Å/min | 1500 Å/min | 1500 Å/min | 2000 Å/min | 1500 Å/min |
| Uniformity in working | good | good | bad | bad | bad |
| Shape | good | good | good | bad | bad |
| Total estimation | ○ | ○ | x | x | Δ |

As can be understood from the above table, in the method according to the invention, it is possible to form the side wall having a superior planarization, uniformity in thickness, and uniformity for etching. Further, the etching rate of the side walls formed by the novel methods Nos. 1 and 2 according to the invention has been confirmed to be very fast. Moreover, no void is formed in these side walls, and the water is scarcely desorbed out of these side walls. Therefore, the total estimation of the side walls manufactured by the novel methods Nos. 1 and 2 according to the invention is very high as compared with those of the side walls formed by the known methods Nos. 1, 2 and 3. It should be noted that according to the invention similar merits to those of the above embodiment 11 can be equally obtained in the embodiments other than the embodiment 11.

Embodiment 12

In this embodiment, a gate oxide film 42 having a thickness of 3000Å is formed on a silicon substrate 41 and then a gate electrode 43 made of polysilicon is formed on the gate oxide film as illustrated in FIG. 8A. Next, a thermal oxide film 48 having a thickness of 300Å is formed on an exposed portion of the gate oxide film 42 as well as on the gate electrode 43.

Then, the surface of the thermal oxide film 48 is treated with ethanol by means of the spin coater. In the present embodiment, the silicon wafer is rotated at 2000 rpm and the ethanol is supplied for three seconds at a rate of 1 ml/sec, and then the silicon wafer is dried for forty seconds.

Next, the silicon wafer is transported into the reaction chamber and the AP ozone-TEOS CVD NSG film 44 is deposited on the thermal oxide film 48 under the entirely same conditions as those of the embodiment 11.

Then, the thus deposited ozone-TEOS CVD NSG film 44 is anisotropically etched back to form a side wall 45 made of the ozone TEOS CVD NSG material as shown in FIG. 9B. It has been experimentally confirmed that the thus formed side wall 45 has no void formed therein and has excellent properties like as the embodiment 11. It should be noted that according to the invention, the AP ozone-TEOS CVD NSG film 44 formed on the thermal oxide film 48 may be utilized as the first interlayer insulating film. In such a case, the etch back step is not performed.

Embodiment 13

Like as the embodiment 11, use is made of the apparatus shown in FIG. 1, but in the present embodiment, TMOS is contained in the gas bubbler 7.

As shown in FIG. 7A, a gate oxide film 42 having a thickness of 300Å is formed on a silicon wafer 41, and then a gate electrode 43 made of polysilicon is formed on the gate oxide film. Next, the surfaces of the gate oxide film 42 and gate electrode 43 are treated by methanol. To this end, the silicon wafer is placed on a spin coater and is rotated at 2000 rpm, and the methanol is applied onto the silicon wafer surface at a flow rate of 1 ml/sec for three seconds. After that, the silicon wafer is rotated at 2000 rpm for forty seconds for drying.

Then, the silicon wafer is transported into the reaction chamber shown in FIG. 1 and an ozone-methyltrimethoxysilane CVD NSG film having a thickness of 4000Å is formed by the deposition of the atmospheric pressure ozone-methyltrimethoxysilane CVD NSG material under the following conditions. That is to say, the methyltrimethoxysilane is contained in the gas bubbler and the thermostat is heated at 45° C.

deposition temperature: 400° C.
deposition pressure: atmospheric pressure
deposition time: 360 seconds
nitrogen supply rate to gas bubbler: 1.5 l/min
temperature of thermostat: 45° C.
oxygen supply rate to ozonizer: 7.5 l/min
ozone concentration: 5 weight %
supply rate of carrier nitrogen: 18 l/min Next, the ozone-methyltrimethoxysilane CVD NSG film thus deposited is anisotropically etched back over its whole surface to form a side wall provided on a side surface of the gate electrode.

It has been experimentally confirmed that the side wall formed by the above method including the surface treatment has excellent properties and has no void formed therein, and an amount of the gases evolved from the side wall is small like as the embodiment 11. Moreover, the side wall can be formed to have a good shape, so that the ozone-methyltrimethoxysilane CVD NSG film can be thinned and the etching time can be shortened correspondingly.

Embodiment 14

FIG. 10 is a cross sectional view showing a portion of a semiconductor device manufactured by the method according to the invention. On a silicon substrate 51 is formed a thermal oxide film 52 having a thickness of 300Å, and then a polysilicon pattern 53 having a step of 1 μm is formed on the thermal oxide film 52 such that a line width is 0.5 μm and a space width is 0.5 μm. Next, on the polysilicon pattern 53 is formed a thermal oxide film 54 having a thickness of 200Å. Then, a surface of the thermal oxide film 54 is treated by ethanol, and then, the silicon wafer is transported into the reaction chamber shown in FIG. 1. Then, an ozone-TEOS CVD NSG film 55 having a thickness of 5000Å is formed on the thermal oxide film 54.

In the present embodiment 14, the surface treatment using the ethanol is carried out by using the spin coater. That is to say, the silicon wafer is placed on the spin coater and is rotated at 2000 rpm. During the rotation, the ethanol of 3 ml is applied onto the surface of silicon wafer for three seconds, and then the silicon wafer is dried by rotating it at 2000 rpm for forty seconds.

After the surface of the thermal oxide film 54 has been treated in the manner mentioned above, the silicon wafer is transported into the reaction chamber depicted in FIG. 1 and the ozone-TEOS CVD NSG film 55 is deposited to have a thickness of 5000Å under the same conditions as those of the embodiment 11.

The ozone-TEOS CVD NSG film 55 thus formed a superior step coverage and thus narrow spaces having a high aspect ratio can be sufficiently filled with the ozone-TEOS CVD NSG material. Further, the planarization capability of the ozone-TEOS CVD NSG film is excellent. Moreover, any void and crack are not formed in the ozone-TEOS CVD NSG film 55.

Comparative Example 5

FIG. 11 is a cross sectional view showing a part of a semiconductor device manufactured by the present comparative example 5. In the comparative example 5, a thermal oxide film 62 having a thickness of 300Å is formed on a silicon wafer 61, and then a polysilicon pattern 63 having a step of 1 μm is formed on the thermal oxide film 62 such that a line width is 0.5 μm and a space width is 0.5 μm. Next, on the polysilicon pattern 63 is formed a thermal oxide film 64 having a thickness of 200Å. Then, the silicon wafer is transported into the reaction chamber shown in FIG. 1 without performing the surface treatment. Then, an ozone-TEOS CVD NSG film 65 having a thickness of 5000Å is formed on the thermal oxide film 64. This comparative example 5 is similar to the embodiment 14 explained above except for the step of treating the surface of the thermal oxide film 64 by using the organic compound prior to the deposition of the ozone-TEOS CVD NSG film 65.

In the comparative example 5, the step coverage of the ozone-TEOS CVD NSG film 65 is inferior and many voids 66 are formed therein. Further, large protrusions and depressions 67 are formed in the surface of the ozone-TEOS CVD NSG film 65. Moreover, it has been confirmed that a large amount of gases, particularly the water is evolved from the ozone-TEOS CVD NSG film 65.

Embodiment 15

In the present embodiment 15, use is made of an aqueous ethanol solution as the organic compound for the surface treatment and the aqueous ethanol solution is applied onto the surface of the silicon wafer by the spin coating method.

Similar to the first embodiment 1 shown in FIG. 2, a BPSG film 12 having a thickness of 6000Å is formed on a silicon wafer 11 and then an aluminum wiring 13 having a height of 1 μm is formed on the BPSG film 12 such that a line width is 0.5 μm and a space width is 0.5 μm. Then, a plasma-TEOS CVD NSG film 14 having a thickness of 3000Å is formed on the BPSG film 12 and aluminum wiring 13 under the same conditions as those of the embodiment 1. Then, the 80% aqueous ethanol solution is applied onto the surface of the silicon wafer with the aid of the spin coater. Then, the silicon wafer is fed into the reaction chamber shown in FIG. 1 and an ozone-TEOS CVD NSG film having a thickness of 1 μm is formed on the silicon wafer under the same conditions as those of the embodiment 1. Also in the present embodiment 14, the ozone-TEOS CVD NSG film having an excellent property can be formed and narrow spaces between successive lines of the aluminum wiring 13 are effectively filled with the ozone-TEOS CVD NSG material and no void is formed in the ozone-TEOS CVD NSG film. Moreover, an amount of desorbed gases from the film is very small.

In case of using the aqueous ethanol solution as the agent for the substrate surface treatment, the concentration of the aqueous ethanol solution has to be made higher than 60%, preferably higher than 70%. If the concentration of the aqueous ethanol solution is not higher than 60%, it is sometimes impossible to obtain the insulating film having a good properties.

In the embodiments so far explained, the chemical vapor deposition for forming the insulating film is performed under the atmospheric pressure, however according to the invention, the chemical vapor deposition may be carried out under a pressure lower than the atmospheric pressure, i.e. low pressure or sub-atmospheric pressure.

Embodiment 16

Similar to the first embodiment 1, on a silicon substrate 11, a BPSG film having a thickness of 6000Å is formed, and then an aluminum wiring 13 having a thickness of 1.2 μm is formed on the BPSG film such that a line width is 0.4 μm and a space width is 0.4 μm. Next, a plasma TEOS CVD NSG film 14 having a thickness of 3000Å is formed on the BPSG film 12 and aluminum wiring 13 is formed under the same condition as those of the first embodiment 1. The plasma TEOS CVD NSG film 14 has a thickness of 3000Å on the aluminum wiring 13 and a thickness of about 1000Å on the side wall of the aluminum wiring. In this manner, depressions having an aspect ratio of about 6 (1.2/(0.4−0.1× 2) is formed in the surface of the silicon wafer.

Then, the surface of the silicon wafer is treated with ethanol by-means of the spin coater. The conditions for processing the silicon wafer with the ethanol are same as those of the first embodiment.

Next, the silicon wafer is transported into the reaction chamber shown in FIG. 1, and a reduced pressure $O_3$ having a thickness of 10000Å is formed on the silicon wafer under the following conditions:
deposition temperature: 400° C.
deposition pressure: 20 Torr
deposition time: 545 seconds
nitrogen supply rate to gas bubbler: 1.5 l/min
temperature of thermostat: 65° C.
oxygen supply rate to ozonizer: 7.5 l/min
ozone concentration: 5 weight %

The low pressure ozone-TEOS CVD NSG film 15 thus obtained has superior step coverage and planarization and no void is formed therein. Moreover, an amount of desorbed gases from the ozone-TEOS CVD NSG film 15 is very small.

According to the invention, when use is made of the low pressure CVD, the pressure during the chemical vapor deposition may be lower than the atmospheric pressure (760 Torr), but when the pressure is reduced lower than 400 Torr, the step coverage is remarkably improved. Moreover, when the pressure is reduced lower than 20 Torr, the free mean path of the molecular of the organic silicon compound becomes substantially identical with the depth of the fine recess, so that the step coverage is further improved. However, the lower the pressure is, the lower the deposition rate, so that the pressure has to be determined by compromising the step coverage and deposition rate. According to the invention, it has been experimentally confirmed that the pressure during the chemical deposition is preferably set to a value within a range from 2 to 400 Torr.

Comparative Example 6

This comparative example 6 is similar to the embodiment 16, but the surface treatment with the ethanol is not performed. The ozone-TEOS CVD is carried out under the low pressure of 20 Torr. An ozone-TEOS CVD NSG film thus obtained shows a poor step coverage and has a number of voids. Further the planarization is also poor.

Embodiment 17

This embodiment 17 is similar to the first embodiment 1 shown in FIG. 2. In the first embodiment 1, the surface of the silicon wafer is treated with the ethanol under the room temperature prior to the chemical vapor deposition, but in the present embodiment 17, the ethanol is heated at 40° C. That is to say, after the silicon wafer is placed on the spin coater, it is rotated at 3000 rpm, and during the rotation, the ethanol heated at 40° C. is supplied for one second at 5 ml/sec. Then, the silicon wafer is rotated at the same speed for sixty seconds for drying. The remaining steps of the present embodiment 17 are entirely same as those of the first embodiment 1 and an ozone-TEOS CVD NSG film having excellent properties can be obtained.

The ozone-TEOS CVD NSG film thus formed show excellent step coverage and flatness and has no void. Particularly, the planarization capability for narrow spaces of the ozone-TEOS CVD NSG film is superior. By the observation of the electron microscope photographs, it has been experimentally confirmed that an average value of residual step ΔH amounts only 0.05% over the whole surface of the silicon wafer. Moreover, variations in the flatness and thickness are very small over the whole surface of the silicon wafer and an amount of the contained water is very small such as 1.0%.

Embodiment 18

Similar to the embodiment 17, the plasma TEOS CVD NSG film is formed on the BPSG film as well as the aluminum wiring. Then, the silicon wafer is heated to a temperature of 30° C. and the surface of the plasma TEOS CVD NSG film is treated by the methanol of the room temperature by means of the spin coater under the same conditions as those of the embodiment 17. After that, the ozone-TEOS CVD NSG film is deposited on the plasma TEOS CVD NSG film under the same conditions as those of the first embodiment 1. Also in the present embodiment, the ozone-TEOS CVD NSG film has excellent step coverage and flatness and any void is not formed within the film.

According to the invention, by heating at least one of the silicon wafer and the organic compound for the surface treatment for reducing the substrate dependency of the insulating film, the flatness of the insulating film can be especially improved. That is to say, the residual step ΔH can be reduced smaller than 0.05 μm. In the first embodiment in which the surface treatment is carried out at the room temperature, the residual step amounts sometimes 0.1 μm.

According to the invention, the underlaying oxide film such as the plasma TEOS CVD film may be eliminated. In the following embodiments, the method according to the invention is applied to the formation of the interlayer insulating film without the underlaying oxide film.

Embodiment 19

In the present embodiment, the interlayer insulating film is to be formed. As illustrated in FIG. 12, a BPSG film 72 having a thickness of 6000Å is formed on a silicon substrate 71, and on the BPSG film is provided a first metal wiring. In the present embodiment, the metal wiring is formed by selectively etching a composite metal film consisting of first TiN film 73, aluminum film 74 and second TiN film 75 having thicknesses of 0.1 μm, 0.8 μm and 0.1 μm respectively. In this manner, the metal wiring having a height of 1 μm, a line width of 0.5 μm and a space width of 0.5 μm. The TiN films 73 and 75 serve as the anti-reflection film or barrier metal.

Next the surface of the silicon wafer is treated with ethanol by means of the spin coater in a similar manner as the first embodiment. Then, the silicon wafer is transported into the reaction chamber shown in FIG. 1, and an ozone-HMDS CVD NSG film 76 having a thickness of 10000 μm is formed on the BPSG film 72 as well as on the metal wiring under the same conditions as those of the first embodiment 1 except for the temperature of the thermostat. That is to say, in the present embodiment, HMDS is contained in the gas bubbler, so that the thermostat is heated at 75° C. Very narrow spaces between successive lines of the metal wiring are fully filled with the ozone-HMDS CVD NSG material and the surface of the ozone-HMDS CVD NSG film 76 is flattened to a very high degree, so that a second metal wiring layer may be formed accurately and reliably on this ozone-TEOS CVD NSG film 76. Further, this insulating film 76 is entirely free from a void.

Embodiment 20

According to the invention, not only the interlayer insulating film between metal or polysilicon wiring layers, but also the passivation film may be equally formed. In this embodiment 20, the final insulating film serving as the passivation film is to be formed.

As illustrated in FIG. 13, on a silicon substrate 81 is formed a BPSG film 82 having a thickness of 6000Å, and a polysilicon wiring 83 is formed on the BPSG film 82. On the BPSG film 82 and polysilicon wiring 83 is formed a primary insulating film 84 having a thickness of 1.5 μm made of a plasma TEOS CVD NSG. On the plasma TEOS CVD NSG film 84 is formed a second aluminum wiring 85 having a height of 1 μm, a line width of 0.5 μm and a space width of 0.5 μm. On this aluminum wiring 85-1 as well as on the exposed portion of the plasma TEOS CVD NSG film 84 is formed a plasma TEOS CVD NSG film 86-1 having a thickness of 1 μm. This plasma TEOS CVD NSG film 86-1 is formed under the same conditions as those under which the plasma TEOS CVD NSG film 14 in the first embodiment 1 is formed. Next, the surface of the plasma TEOS CVD NSG film 86-1 is treated by ethanol by means of the spin coater. This substrate surface treatment is carried out under the same conditions as those of Embodiment 1.

Further, on the plasma TEOS CVD NSG film 86-1 is deposited an AP ozone-TEOS CVD NSG film 87-1 having a thickness of 10000Å. On this AP ozone TEOS CVD NSG film 87-1 serving as a first interlayer insulating film is further formed a second aluminum wiring 85-2, and an exposed portion of the ozone-TEOS CVD NSG film 87-1 as well as the aluminum wiring 85-1 is deposited a plasma TEOS CVD NSG film 86-2 under the same conditions as those for forming the plasma TEOS CVD NSG film 86-1.

Next, the surface of the plasma TEOS CVD NSG film 86-2 is treated by ethanol by means of the spin coater. This substrate surface treatment is carried out under the same conditions as those of the first embodiment 1. Then, the silicon wafer is fed into the reaction chamber and an ozone-TEOS CVD PSG (phosphor silicate glass) film 87-2 having a thickness of 1 μm is formed on the plasma TEOS CVD NSG film 86-2 under substantially the same conditions as those of the embodiment 1.

In the present embodiment, $PO(OCH_3)_3$ is used as a compound including phosphorous, but any other compounds such as $(CH_3)_3P$ and $(CH_3)_3PO$ may be used. Further, it is also possible to use compounds including Si—P such as $PO[OSi(CH_3)_3]_3$, $P[OSi(CH_3)_3]_3$ $(CH_3O)POSi(OCH_3)_3$ and $Si[OPO(OCH_3)_2]_4$.

As shown in FIG. 13, on the ozone-TEOS CVD PSG film 87-2 is further formed a plasma SiN film 88 having a thickness of 0.5 μm in order to improve the faculty for preventing the penetration of moisture and mobile metal ions into the insulating film.

It should be noted that in the present embodiment 20, the ozone-TEOS CVD PSG film 87-2 is formed as the passivation film, it is also possible to form the ozone-TEOS CVD NSG film, and further the metal wiring 85 may be formed on any insulating oxide film such as SOG instead of the BPSG film 82.

Embodiment 21

As depicted in FIG. 14, a BPSG film 82 is formed on a silicon substrate 81, an aluminum wiring 83 is formed on the BPSG film 82, a plasma TEOS CVD NSG film 84 is formed on the BPSG film 82 as well as on the aluminum wiring 83, and an aluminum wiring 85 is formed on the plasma TEOS CVD NSG film 84. The steps so far explained are same as those of the previous embodiment 20 shown in FIG. 13. In the present embodiment 20, on the plasma TEOS CVD NSG film 84 and aluminum wiring 85 is formed a silicon nitride film 89. The silicon nitride film 89 may be formed by various known methods. In the present embodiment 21, the silicon nitride film 89 is formed by a plasma CVD SiN film using the reaction between monosilane and nitrogen. According to the invention, the silicon nitride film 89 may be formed by a plasma silicon oxynitride film, which may be formed by the reaction of the silane, dinitrogenmono oxide and nitrogen; the gas-solid state reaction between the ammonia and an oxide film or between the oxygen or oxidizing gas and a nitride film.

Next, the surface of the plasma CVD SiN film 89 is treated by ethanol by means of the spin coater under the same conditions as those of the first embodiment 1. Then, the silicon wafer is transported into the reaction chamber and an ozone-TEOS CVD PSG film 88 is formed on the ozone-TEOS CVD silicon nitride film 89 under the same conditions as those of the embodiment 19. The thus formed ozone-TEOS CVD PSG film 88 serves as the passivation film.

According to the invention, the plasma CVD SiN film may be used as the dielectric film for a capacitance. In such a case, a lower electrode metal film having a thickness of 0.2 µm is selectively formed on the underlaying insulating film, and then, the plasma CVD silicon nitride film having a thickness of 0.05 µm is deposited under the same conditions as those mentioned above. Next, after a surface of the plasma CVD SiN film has been treated with ethanol, the silicon wafer is transported into the reaction chamber shown in FIG. 1 and an ozone-TEOS CVD NSG film having a given thickness is formed on the plasma CVD SiN film. Finally, an upper electrode of the capacitance is formed on the thus formed ozone-TEOS CVD NSG film to form the capacitance.

Embodiment 22

In the present embodiment, the ozone-TEOS CVD NSG film is formed on a silicon oxide film produced by an ECR PE CVD (Electron Cyclotron Resonance Plasma-Enhanced Chemical Vapor Deposition). The ECR PE CVD silicon oxide film is formed under a relatively low pressure such as $10^{-2}$ Torr, so that it has a good step coverage and an amount of residual water is small. Further, the density of the ECR PE CVD silicon oxide film is very high, and thus the water and other ions could hardly penetrate therethrough. However, the ECR PE CVD silicon oxide film has a large amount of silanol groups on its surface, so that it is not suitable as the substrate for the deposition of ozone-TEOS CVD film. That is to say, when the ozone-TEOS CVD film is formed on the ECR PE CVD silicon oxide film, there are formed many voids and the step coverage of the ozone-TEOS CVD film is poor.

In the present embodiment 22, the above mentioned drawback is removed by treating the surface of the ECR PE CVD silicon oxide film with the organic compound.

As shown in FIG. 15, on a silicon substrate 11 there is formed a BPSG film 12 having a thickness of 6000Å. Then an aluminum film having a thickness of 1 µm is formed on the BPSG film 12, and recesses having a depth of 1.1 µm is selectively formed in the aluminum film to form an aluminum wiring 13 having a line width of 0.5 µm and a space width of 0.5 µm. Next, a silicon wafer is washed with the pure water, and then an ECR PE CVD NSG film 28 having a thickness of 1800Å is formed on the BPSG film 12 as well as on the aluminum wiring 13 by using $SiH_4$ as a raw material gas and an oxygen gas as a reaction gas under the following conditions.

deposition temperature: 350° C.
deposition pressure: 5 mTorr
deposition time: 30 seconds
supply rate of $SiH_4$: 30 scc (standard cubic centimeter per minute)
supply rate of $O_2$: 80 scc
frequency of microwave: 2.45 GHz Next, the silicon wafer is treated with ethanol by means of the spin coater. That is to say, the silicon wafer is placed on the spin coater and is rotated at 3000 rpm. During the rotation, the ethanol of 3 ml is supplied for one second and then the silicon wafer is continued to be rotated for three minutes.

Then, the silicon wafer is introduced into the reaction chamber shown in FIG. 1 and an ozone-TEOS CVD NSG film 15 is deposited on the ECR PE CVD NSG film 28 under the following conditions, while the oxygen gas containing the ozone gas by 5 weight % is used as the reaction gas.

deposition temperature: 400° C.
deposition pressure: atmospheric pressure
deposition time: 600 seconds
nitrogen supply rate to gas bubbler: 1.5 l/min
temperature of thermostat: 65° C.
oxygen supply rate to ozonizer: 7.5 l/min
ozone concentration: 5 weight %

In the embodiments so far explained, the substrate surface is treated by only a single kind of the organic compound, but according to the invention, the substrate surface may be treated with a plurality of organic compounds simultaneously or successively.

Embodiment 23

This embodiment 23 is similar to the first embodiment 1, but is different therefrom in a point that the surface treatment is performed by using two kinds of organic compounds. That is to say, after the aluminum wiring is formed on the BPSG film, the silicon wafer is first treated with a mixture of ethanol and methanol (1:1) by means of the spin coater under the same conditions as those of the embodiment 1. Next, the silicon wafer is transported into the reaction chamber and the ozone-TEOS CVD NSG film is formed on the exposed portion of the BPSG film as well as on the aluminum wiring. The conditions for depositing the ozone-TEOS CVD NSG film are entirely same as those of the first embodiment 1.

Embodiment 24

This embodiment 24 is similar to the first embodiment 1 except for the manner of treating the surface of the silicon wafer prior to the deposition of the ozone-TEOS CVD NSG film. That is to say, in the present embodiment, the surface of the silicon wafer is first treated with the ethanol and then the silicon wafer is again treated with the diethylene glycol monomethyl ether. To this end, the silicon wafer is placed on the spin coater and is rotated at 3000 rpm. During the rotation, 5 ml of the methanol is supplied for one second and then the silicon wafer is rotated for fifteen second to dry the methanol. The silicon wafer is continued to be rotated at 3000 rpm and 10 ml of the diethylene glycol monomethyl ether is supplied for one second, and then the silicon wafer is rotated for three minutes for drying.

After that, the silicon wafer is transported into the reaction chamber and the ozone-TEOS CVD NSG film is deposited under the same conditions as those of the first embodiment.

Embodiment 25

In all the above explained embodiments except for the embodiments 9 and 10, the substrate surface is treated with the organic compound by means of the spin coater. In case of using the spin coater, the silicon wafers have to be processed one by one, because on the spin coater only one silicon wafer can be placed. Therefore, the efficiency of the surface treatment is limited. Moreover, when a diameter of the silicon wafer becomes larger such as 8 inches, it is rather difficult to effect the surface treatment uniformly over the whole surface of the silicon wafer. According to the invention, the substrate surface treatment may be carried out by various methods. In the present embodiment 25, the surface of the silicon wafer is treated with ethanol by means of the dipping.

After forming the aluminum wiring pattern on the BSPG film as in the same manner as the first embodiment 1, twenty three silicon wafers 91 are set in a cassette 92 as shown in FIG. 16, and then the cassette is supported by an arm 93 and is inserted into a vessel 96 made of polytetrafluoroethylene. Then, ethanol 94 heated at 30° C. is introduced into the vessel 96 from its bottom up to an upper drain pipe in order to prevent the generation of undesired air bubbles. The ethanol 94 introduced into the vessel is heated by heaters 95 which are coated with polytetrafluoroethylene. The silicon wafers 91 are fully immersed in the ethanol 94 for twenty seconds, while the cassette is swung right and left. After that, the ethanol 94 is drained out of the vessel 96 from the bottom, and then the arm 93 and thus the cassette 92 are moved upward and the silicon wafers 91 are drawn from the vessel 96, and then the silicon wafers 91 are dried by blowing a nitrogen gas heated at 60° C. In the present embodiment, twenty three silicon wafers 91 can be treated at once, so that the substrate surface treatment per one silicon wafer is only about three seconds. Contrary to this, in the first embodiment 1, the substrate surface treatment requires about one minute.

It should be noted that according to the invention, the silicon wafers may be treated by the dipping method one by one. In such a case, the silicon wafers may by introduced into the ethanol.

Embodiment 26

In the present embodiment, the substrate surface treatment is performed by means of a curtain flow coater. As depicted in FIG. 17, a silicon wafer 101 is transported through a curtain flow coater 102, which is provided in a space between successive conveyer belts 103 and 104. The curtain flow coater 102 comprises a vessel 105 containing the ethanol 106, a pipe 107 and a pump 108 for supplying the ethanol to a slit nozzle 109 arranged above the feeding path of the silicon wafer 101, and a receptor 110 for receiving a curtain wall 111 of the ethanol. The silicon wafer 101 is fed by the conveyer belts 103 and 104 at a given speed and passes through the curtain wall 111 of ethanol and thus the surface of the silicon wafer is treated by the ethanol. After that, the silicon wafer 101 is contained in a cassette 112 and are dried therein by blowing a nitrogen gas heated at 80° C. from a nozzle 113. In this manner, the silicon wafers 101 can be successively processed in an effective manner. The surface treating time for one silicon wafer is only about 0.5 seconds.

Embodiment 27

In the present embodiment 27, the silicon wafer is processed by means of a spray coater 114 shown in FIG. 18. A silicon wafer 101 is fed in a direction shown by an arrow by means of a series of conveyer rollers 115, and below the feeding path of the silicon wafer is arranged a tank 116 containing methanol 117, into which one end of a pipe 118 is inserted. The other end of the pipe 118 is communicated with a spray nozzle 119 arranged above the feeding path of the silicon wafer 101. To the spray nozzle 119 is also connected one end of a pipe 120 whose other end is communicated with a bottle 121 containing nitrogen at a pressure of 1 Kg/cm$^2$. During the silicon wafer 101 is fed under the spray nozzle 119, a methanol spray 122 is blown against the silicon wafer for ten seconds by using the nitrogen gas as the carrier gas and then, the supply of the methanol is stopped by closing a valve 123 in the pipe 118 and only the nitrogen gas is blown against the silicon wafer to dry the silicon wafer. In the present embodiment, the substrate treatment time is about thirteen seconds for one silicon wafer.

In the embodiments so far explained, the substrate surface is treated with the organic compound prior to the deposition of the insulating film using the organic silicon compound. According to the invention, an organic compound gas for reducing the dependency of the insulating film upon the substrate surface may be supplied to the reaction chamber together with a raw material gas and a reaction gas.

Embodiment 28

As shown in FIG. 19, a BPSG film 132 having a thickness of 6000Å is formed on a silicon substrate 131, and then an aluminum wiring 133 having a thickness of 1 µm is formed on the BPSG film 132 such that a line width is 0.5 µm and a space width is 0.5 µm. In the present embodiment, the silicon wafer is transported into a reaction chamber without performing the substrate surface treatment with the organic compound and an ozone-TEOS CVD NSG film 134 having a thickness of 8000Å is formed under the atmospheric pressure by using a mixture of a raw material gas, reaction gas and an organic compound gas as will be explained hereinbelow.

Figure 20:
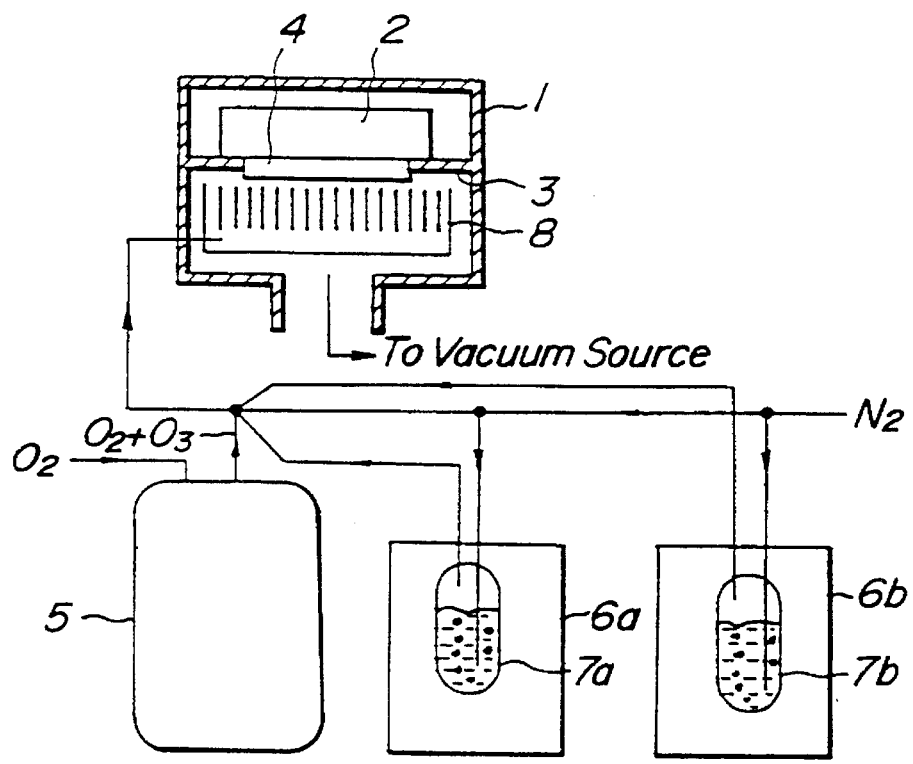
FIG. 20 is a schematic view representing another embodiment of the CVD reactor for used in the method according to the invention.

FIG. 20 is a schematic view showing the construction of the chemical vapor deposition device for use in the present embodiment. In FIG. 20, portions similar to those illustrated in FIG. 1 are denoted by the same reference numerals used in FIG. 1. In the present embodiment, there are provided first and second thermostats 6a and 6b each containing first and second gas bubblers 7a and 7b, respectively. In the first gas bubbler 7a, there is contained an organic silicon compound and in the second gas bubbler 7b, there is contained an organic compound for reducing the dependency of the insulating film upon the substrate surface. The remaining constructions of the present CVD device are similar to the CVD device shown in FIG. 1.

In the present embodiment, TEOS is contained in the first gas bubbler 7a and ethanol is contained in the second gas bubbler 7b, and the CVD is carried out under the following conditions.

deposition temperature: 400° C.
deposition pressure: atmospheric pressure
deposition time: 480 seconds
nitrogen supply rate to 1st gas bubbler: 3.0 l/min
nitrogen supply rate to 2nd gas bubbler: 0.1 l/min
temperature of 1st thermostat: 65° C.
temperature of 2nd thermostat: 25° C.
oxygen supply rate to ozonizer: 7.5 l/min
ozone concentration: 5 weight %
supply rate of carrier nitrogen: 18 l/min The thus formed ozone-TEOS CVD NSG film 134 has an excellent step coverage and very narrow spaces between successive lines of the aluminum wiring 133 can be sufficiently filled with the ozone-TEOS CVD NSG material. Moreover, the planarization of the ozone-TEOS CVD NSG film 134 is also good. Further, the ozone-TEOS CVD NSG film 134 has no void formed therein. Further an amount of water and carbon contained in the ozone-TEOS CVD NSG film 134 thus formed is very small and the moisture resistance is high.

Embodiment 29

In the present embodiment 29, as shown in FIG. 21A, on a silicon substrate 131 is formed a BPSG film 132 having a thickness of 6000Å, and then an aluminum wiring 133 having a thickness of 1 μm, a line width of 0.5 μm and a space width of 0.5 μm is formed on the BPSG film 132. Next, the silicon wafer is introduced into the plasma CVD reaction chamber and a plasma TEOS CVD NSG film 135 is deposited as illustrated in FIG. 21B. This plasma CVD process is carried out by using TOES and $N_2$ as the raw material gas and the ethanol gas as the organic compound gas for reducing the dependency of the insulating film upon the substrate surface under the following conditions.
deposition temperature: 350° C.
deposition pressure: 0.35 Torr
deposition time: 120 seconds
nitrogen supply rate to 1st gas bubbler: 400 SCCM
temperature of 1st thermostat: 65° C.
nitrogen supply rate to 2nd gas bubbler: 300 SCCM
temperature of 2nd thermostat: 25° C.
carrier nitrogen supply rate: 400 SCCM
electrode distance: 35 mm
RF power: 0.8 W/cm$^2$
RF frequency: 50 KHz Next, the silicon wafer is transported into the reaction chamber shown in FIG. 1 and an ozone-TEOS CVD NSG film 134 having a thickness of 6000Å is formed on the plasma TEOS CVD NSG film 135 as depicted in FIG. 21C. In the present embodiment, the ethanol gas for reducing the dependency upon the substrate surface is mixed with the raw material gas and reaction gas, and the reaction is performed under the following conditions.
deposition temperature: 400° C.
deposition pressure: atmospheric pressure
deposition time: 360 seconds
nitrogen supply rate to 1st gas bubbler: 3.0 l/min
temperature of 1st thermostat: 65° C.
nitrogen supply rate to 2nd gas bubbler: 0.1 l/min
temperature of 1st thermostat: 25° C.
oxygen supply rate to ozonizer: 7.5 l/min
ozone concentration: 5 weight %

The ozone-TEOS CVD NSG film 134 thus obtained has excellent step coverage and planarization and has no void formed therein.

Embodiment 30

In this embodiment 30, similar to the embodiment 29, the aluminum wiring pattern 133 is formed on the BPSG film 132 formed on the silicon substrate 131, and then the plasma TEOS CVD NSG film 135 is deposited under the same conditions as those of the embodiment 29. That is to say, the mixture of the raw material gas consisting of the TEOS and $N_2O$ and the ethanol gas is supplied to the reaction chamber. Then, the ozone-TEOS CVD NSG film having 6000Å is formed on the plasma TEOS CVD NSG film under the low pressure CVD using the TEOS gas, the oxygen gas containing the ozone and the ethanol gas. The deposition is carried out under the following conditions.
deposition temperature: 400° C.
deposition pressure: 600 Torr
deposition time: 385 seconds
nitrogen supply rate to 1st gas bubbler: 400 SCCM
temperature of 1st thermostat: 65° C.
nitrogen supply rate to 2nd gas bubbler: 300 SCCM
temperature of 1st thermostat: 25° C.
oxygen supply rate to ozonizer: 7.5 l/min
ozone concentration: 5 weight %

Narrow spaces between the aluminum wiring lines can be sufficiently filled with the thus formed plasma TEOS CVD NSG film and sub-atmospheric pressure ozone-TEOS CVD NSG film and further the surface of the ozone-TEOS CVD NSG film is planarized to a high degree. Moreover, no void is formed within the ozone-TEOS CVD NSG film and an amount of gases desorbed from the insulating film is very small.

Embodiment 31

In the present embodiment, similar to the first embodiment 1 shown in FIG. 2, the aluminum wiring is formed on the BPSG film provided on the silicon substrate, and then the plasma TEOS CVD NSG film having a thickness of 2000Å is deposited on the aluminum wiring as well as the exposed portion of the BPSG film under the same conditions as those in the embodiment 1. In the present embodiment, the silicon wafer is introduced into the reaction chamber shown in FIG. 20, and the ozone-TEOS CVD NSG film is deposited on the plasma TEOS CVD NSG film under the entirely same conditions as those of the embodiment 28. Also in the present embodiment 30, it is possible to obtain the ozone-TEOS CVD NSG film having the superior properties.

Embodiment 32

Similar to the embodiment 31, on the aluminum wiring is formed the plasma TEOS CVD NSG film under the following conditions.
deposition temperature: 400° C.
deposition pressure: 0.35 Torr
deposition time: 120 seconds
nitrogen supply rate to gas bubbler: 400 SCCM
temperature of thermostat: 65° C.
oxygen gas supply rate: 400 SCCM
electrode distance: 35 mm
RF power: 0.8 W/cm$^2$
RF frequency: 50 KHz Next, the silicon wafer having the plasma TEOS CVD NSG film formed thereon is transported into the reaction chamber shown in FIG. 20 and an ozone-TMOS CVD NSG film is deposited on the plasma TEOS CVD NSG film by using TMOS as the raw material gas and the methanol gas as the organic compound for reducing the dependency of the insulating film upon the substrate surface. The CVD is carried out under the following conditions.
deposition temperature: 400° C.
deposition pressure: atmospheric pressure
deposition time: 360 seconds
nitrogen supply rate to 1st gas bubbler: 1.5 l/min
temperature of 1st thermostat: 65° C.
nitrogen supply rate to 2nd gas bubbler: 300 SCCM
temperature of 1st thermostat: 25° C.
oxygen supply rate to ozonizer: 7.5 l/min
ozone concentration: 5 weight %

In this manner, the ozone-TMOS CVD NSG film having good step coverage and planarization can be obtained. Further, the film has no void formed therein and an amount of gases evolved from the film is very small.

Embodiment 33

Similar to the embodiment 32, aluminum wiring is formed on the BPSG film. In the present embodiment, on the exposed portion of the BPSG film as well as on the aluminum wiring there is deposited a plasma TMOS CVD NSG film having a thickness of 2000Å under the following conditions.
deposition temperature: 400° C.
deposition pressure: 0.35 Torr
deposition time: 120 seconds
nitrogen supply rate to TMOS gas bubbler: 400 SCCM
temperature of thermostat: 25° C.
oxygen gas supply rate: 400 SCCM
electrode distance: 35 mm
RF power: 0.8 W/cm$^2$
RF frequency: 50 KHz Next, the silicon wafer having the plasma TMOS CVD NSG film formed thereon is transported into the reaction chamber shown in FIG. 20 and a ozone-TMOS CVD NSG film is deposited by the atmospheric CVD using the TMOS gas as the raw material gas and the methanol gas as the organic compound gas for reducing the dependency of the insulating film upon the substrate surface under the following conditions.
deposition temperature: 400° C.
deposition pressure: atmospheric pressure
deposition time: 545 seconds
nitrogen supply rate to 1st gas bubbler: 400 SCCM
temperature of 1st thermostat: 65° C.
nitrogen supply rate to 2nd gas bubbler: 300 SCCM
temperature of 2nd thermostat: 25° C.
oxygen supply rate to ozonizer: 7.5 l/min
ozone concentration: 5 weight %

In this manner, the ozone-TMOS CVD NSG film having the excellent properties like as the previous embodiments can be formed.

Embodiment 34

Similar to the embodiment 32, the plasma TEOS CVD NSG film is formed on the exposed portion of the BPSG film as well as on the aluminum wiring. Then, the silicon wafer is fed into the reaction chamber illustrated in FIG. 20 and a sub-atmospheric pressure ozone-TMOS CVD NSG film is deposited on the plasma TEOS CVD NSG film, while the TMOS is contained in the first gas bubbler 7a and the methanol is contained in the second gas bubbler 7b. The sub-atmospheric pressure CVD is carried out under the following conditions.
deposition temperature: 400° C.
deposition pressure: 700 Torr
deposition time: 360 seconds
nitrogen supply rate to 1st gas bubbler: 400 SCCM
temperature of 1st thermostat: 65° C.
nitrogen supply rate to 2nd gas bubbler: 300 SCCM
temperature of 1st thermostat: 25° C.
oxygen supply rate to ozonizer: 7.5 l/min
ozone concentration: 5 weight %

Embodiment 35

Similar to the embodiment 33, the plasma TMOS CVD NSG film is formed on the BPSG film as well as on the aluminum wiring. Then, the silicon wafer is introduced into the reaction chamber shown in FIG. 20 and a low pressure ozone-TMOS CVD NSG film is deposited under the following conditions, while TMOS is contained in the first gas bubbler and the ethanol is contained in the second gas bubbler.
deposition temperature: 400° C.
deposition pressure: 550 Torr
deposition time: 545 seconds
nitrogen supply rate to 1st gas bubbler: 400 SCCM
temperature of 1st thermostat: 65° C.
nitrogen supply rate to 2nd gas bubbler: 300 SCCM
temperature of 1st thermostat: 25° C.
oxygen supply rate to ozonizer: 7.5 l/min
ozone concentration: 5 weight %

The thus formed low pressure ozone-TMOS CVD NSG film has also the excellent properties.

Embodiment 36

In the present embodiment 36, as shown in FIG. 22A, a BPSG film 142 having a thickness of 1.0 μm is formed on a silicon substrate 141, and a composite metal film consisting of a TiN film having a thickness of 0.1 μm and an aluminum film having a thickness of 1.0 μm is formed on the BPSG film. Then, the composite metal film is selectively etched to form a metal wiring 143. In this case the etching is performed such that a depth of recesses amounts to 1.1 μm.

Next, the silicon wafer is washed with the pure water and is then dried. After that, the silicon wafer is transported into the plasma CVD apparatus and a plasma TEOS CVD NSG film 144 having a thickness of 3000Å is formed on the exposed BPSG film 142 as well as on the metal wiring 143 by means of the plasma CVD method as illustrated in FIG. 22B.

Then, the surface of the silicon wafer treated with the ethanol by means of the spin coater under the same conditions as those of the embodiment 1. Next, the silicon wafer is transported into the reaction chamber shown in FIG. 20 and an atmospheric pressure ozone-TEOS CVD NSG film 145 having a thickness of 10000Å is formed on the plasma TEOS CVD NSG film 144 as shown in FIG. 22C. In this case, the TEOS is contained in the first gas bubbler 7a and the ethanol is contained in the second gas bubbler 7b and the CVD is carried out under the same conditions as those of the embodiment 31.

The planarization of the thus obtained ozone-TEOS CVD NSG film 145 has been measured by means of electron microscope photographs. That is to say, a difference ΔH between a height of the top surface of the ozone-TEOS CVD NSG film 145 on the aluminum pattern and a height of the film on the space between successive lines of the metal wiring pattern is measured at many points on the silicon wafer, and then an average of thus measured differences is derived as the average residual step. In the present embodiment, the average residual step is smaller than 0.05 μm. Moreover, fluctuations in the film thickness and the residual step are also smaller than 1%. Further, the water containing ratio of the ozone-TEOS CVD NSG film 145 is smaller than 0.5%.

Embodiment 37

In all the embodiments so far explained, the insulating film is formed by the chemical vapor deposition using the organic silicon compounds as the raw material, but according to the invention, it is possible to form the insulating film by the chemical vapor deposition using inorganic silicon compounds such as monosilane and disilane. In the present embodiment, the insulating film is formed by the chemical vapor deposition using the monosilane.

Similar to the embodiment 1, on a silicon substrate is formed a BPSG film, an aluminum wiring pattern is formed on the BPSG film, and then a plasma TEOS CVD NSG film having a thickness of 3000Å is formed on the aluminum wiring as well as on an exposed portion of the BPSG film. Then, the surface of the silicon wafer is treated with ethanol by means of the spin coater under the same conditions as those of the first embodiment 1. After that the silicon wafer is transported into the CVD reactor and a LTO film having 8000Å is deposited on the plasma TEOS CVD NSG film by the chemical vapor deposition using the silane $SiH_4$ as the raw material under the following conditions.

deposition temperature: 430° C.
deposition pressure: atmospheric pressure
supply rate of $SiH_4$: 0.65 l/min
supply rate of oxygen gas: 0.35 l/min
supply rate of carrier $N_2$ gas: 4.6 l/min Also in the present embodiment 37, it is possible to obtain the LTO film having the superior step coverage and planarization. Further, no void is formed within the LTO film and an amount of gases desorbed from the film is very small.

It should be noted that in the present embodiment, the plasma TEOS CVD NSG film is formed on the aluminum wiring, but in a modified embodiment, such a plasma TEOS CVD NSG film may be dispensed with.

Embodiment 38

In the present embodiment, the insulating film is formed as the primary insulating layer provided on the first conductive material wiring pattern layer and the semiconductor substrate.

As illustrated in FIG. 23, on a silicon substrate 301 there is formed a first conductive material wiring 302 made of polysilicon. The polysilicon wiring 302 has a thickness of 1 μm and a line and space of 0.5 μm. Then, silicon wafer having a diameter of eight inches is washed with the pure water, and a thermal oxide film having a thickness of 50Å is formed on the silicon wafer surface by a dry oxidation. Next, the surface of the silicon wafer is treated with ethanol by means of the spin coater such that silicon wafer is rotated at 3000 rpm and the ethanol of 1 ml is supplied within one second and then the silicon wafer is dried for three minutes. After that, the silicon wafer is transported into the CVD reaction chamber and BPSG film 303 is formed on the wafer surface. This deposition is carried out at 400° C. by using a mixture of $Si(OC_2H_5)_4$, $B(OCH_3)_3$ and $PO(OCH_3)_3$, while the oxygen gas containing the ozone gas by 5 weight % is used as the reaction gas. Then, the BPSG film is reflowed at 700° C. for ten minutes.

Also in this embodiment 38, it is possible to form the BPSG film having superior properties like as the previous embodiments.

Embodiment 39

In the present embodiment, the substrate surface treatment is performed in the plasma CVD reaction chamber. Similar to the first embodiment 1, on a silicon substrate is formed a BPSG film and an aluminum wiring is selectively formed on the BPSG film. Then, the silicon wafer is introduced into a plasma CVD reaction chamber shown in FIG. 24. As illustrated in FIG. 24, the silicon wafers 311 is placed on a lower RF electrode 312 provided in a reaction chamber 313. Above the lower RF electrode 312 is arranged an upper RF electrode 314, and a RF source 315 is connected across the lower and upper RF electrodes 312 and 314. The upper electrode 314 is formed as a nozzle and is communicated with a bottle 315 containing the reaction gas, i.e. oxygen gas as well as with a first gas bubbler 316. In the first gas bubbler 316 is contained TEOS. The first gas bubbler 316 is communicated with a bottle 317 containing the carrier nitrogen gas. The reaction chamber 313 is connected with an evacuation pump 317 by means of a pressure adjusting device 318. Within the lower electrode 312, there is provided a heater 319 for heating the silicon wafers 311 at a given temperature. The construction so far explained is substantially same as that of the ordinary plasma CVD reactor. In the present embodiment, the upper electrode 314 provided in the reaction chamber 313 is communicated with a second gas bubbler 320 via a second valve 321. In the second gas bubbler 319 is contained ethanol.

The silicon wafers 311 are inserted into the reaction chamber 313 and are placed on the lower electrode 312 to proceed the vapor deposition by the reaction between the TEOS gas and the oxygen gas. During this reaction, the valve 321 is closed, so that the plasma TEOS CVD film is formed on the silicon wafer in a usual manner. After the plasma TEOS CVD film has been deposited, the generation of plasma is stopped and the supply of TEOS and $O_2$ is stopped. Then, the valve 321 is opened to introduce the ethanol gas into the reaction chamber 313 and the surface of the plasma TEOS CVD film is treated with the ethanol. After that, the silicon wafers are taken out of the reaction chamber 313 and is transported into the reaction chamber for depositing the insulating film on the plasma TEOS CVD film.

The present invention also relates to an apparatus for carrying out the above mentioned method according to the invention, in which the substrate surface treatment is performed prior to the deposition of the insulating film. Now several embodiments of the apparatus for forming the insulating film of the semiconductor device according to the invention will be explained.

As explained above, in the method according to the present invention, the silicon surface is treated with the organic compound such as the ethanol and methanol for reducing the dependency of the insulating film upon the substrate surface and then the insulating film is deposited by using the organic silicon compound such as TEOS and TMOS. In the apparatus according to the invention, said process can be carried out continuously and thus the throughput can be improved.

Figure 25:
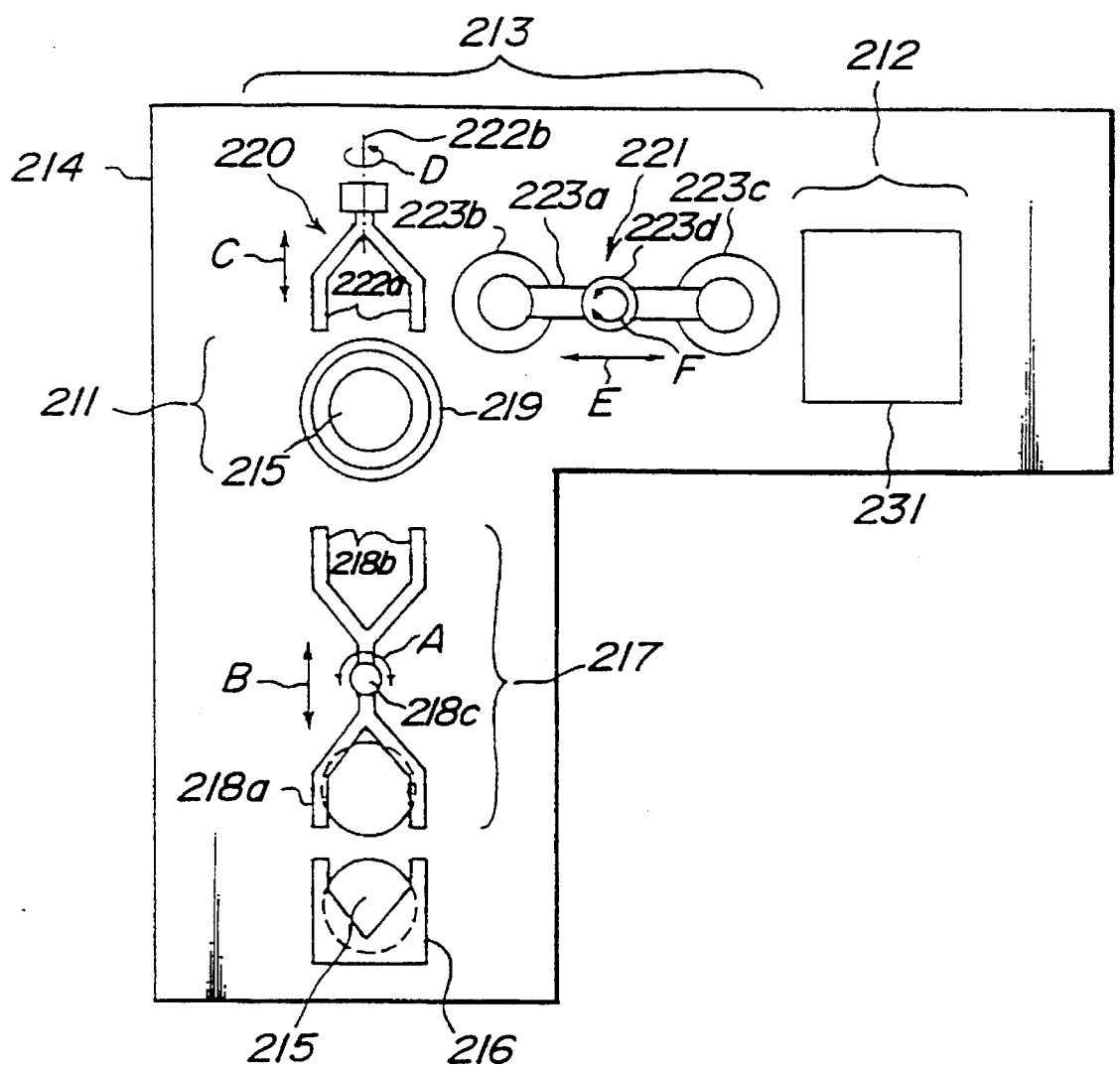
FIG. 25 is a schematic plan view depicting an embodiment of the semiconductor device manufacturing apparatus according to the invention.

FIG. 25 is a schematic plan view showing a first embodiment of the apparatus according to the invention. In the present embodiment, a pre-treating unit 211 for treating silicon wafers one by one, a vapor depositing unit 212 for depositing an insulating film on the silicon wafer one by one and a transporting unit 213 for transporting the silicon wafer one by one from the pre-treating unit 211 to the vapor depositing unit 212 are arranged integrally. That is to say, these units 211, 212 and 213 are provided on a common base member and are arranged within a common housing 214. In the pre-treating unit 211, is arranged a wafer cassette 216 supporting twenty five silicon wafers 215. The pre-treating unit 211 comprises a wafer take-out device 217 for taking the silicon wafers one by one from the cassette 215. The wafer take-out device 217 comprises a pair of fork-like members 218a and 218b which are arranged rotatably about a shaft 218c as shown by an arrow A and the shaft 218c is moved in horizontal plane in a reciprocal manner as illustrated by an arrow B in FIG. 25. Further, the wafer cassette 216 and the wafer take-out device 217 are arranged such that they are moved relative to each other in a direction perpendicular to the plane of the drawing of FIG. 25. For instance, the cassette 216 is moved up and down with respect to the wafer take-out device 217. In this manner, the silicon wafers 215 installed in the wafer cassette 216 can be taken out of the cassette one by one by means of the wafer take-out device 217.

At first, the wafer take-out device 217 is moved toward the wafer cassette 216 and the fork-like member 218a is inserted into the cassette to supports a silicon wafer 215 thereon. Then, the wafer take-out device 217 is moved toward the pre-treating unit 211. During this movement, the wafer take-out device 217 is rotated about the shaft 218c by 180° and the silicon wafer 215 is placed on a spin coater 219 provided in the pre-treating unit 211. After that, the wafer take-out device 217 is moved toward the cassette 216.

In the present embodiment, the silicon wafer 215 comprises a silicon substrate, a BPSG film formed on the silicon substrate, an aluminum wiring having a thickness of 1 µm, a line width of 0.5 µm and a space width of 0.5 µm, and a plasma TEOS CVD NSG film deposited on the BPSG film and aluminum wiring.

In the pre-treating unit 211, the spin coater 219 on which the silicon wafer 215 is placed is rotated at 1000 rpm, and during the rotation, the ethanol is supplied for two seconds at a flow rate of 100 ml/min. After that, the silicon wafer is dried by rotating it at 2000 rpm for sixty seconds.

After the surface of the plasma TOES CVD NSG film has been treated with the ethanol, the silicon wafer 215 is transported into the vapor depositing unit 212. The transporting unit 213 comprises a turning device 220 for taking the silicon wafer 215 out of the spin coater 219 and turning over the silicon wafer up side down, and a feeding device 221 for transporting the silicon wafer into the vapor depositing unit 212. The turning device 220 includes a fork-like member 222a which is moved reciprocally as shown by an arrow C and is rotated about a horizontal shaft 222b by 180° as indicated by an arrow D. After the surface treatment of the silicon wafer has been finished, the fork-like member 222a is moved from a home position shown in FIG. 23 toward the spin coater 219 and the treated silicon wafer 215 is supported on the fork-like member. Then, the fork-like member 222a is returned into the home position and is rotated by 180°. In this manner, the silicon wafer 215 is turned up side down.

The feeding device 221 comprises an arm 223a and a pair of vacuum sucking chucks 223b and 223c each provided at respective ends of the arm. The arm 223a is reciprocally movable as shown by an arrow E and is also rotated about a vertical shaft 223d by 180° as indicated by an arrow F. After the silicon wafer 215 held by the fork-like member 222a of the turning device 220, the arm 223a is moved toward the fork-like member 222a and the wafer is supported by the vacuum chuck 223b. Then, the arm 223a is moved toward the vapor deposition unit 212. During this movement, the arm 223a is rotated by 180°, so that the silicon wafer is transported into the vapor depositing unit 212 in such a manner that its surface, i.e. the surface on which the treated plasma TEOS CVD NSG film is existent is faced downward.

In the vapor depositing unit 212 comprises the reaction device shown in FIG. 1 or FIG. 20. The silicon wafer 215 supported by the vacuum sucking chuck 223c is transported into a reaction chamber 231 of the vapor depositing unit 212. In the present embodiment, the vapor depositing unit 212 is constituted by the apparatus shown in FIG. 1, and the silicon wafer 215 is sucked onto the heater 2.

Then, an ozone-TEOS CVD NSG film is deposited on the plasma TEOS CVD NSG film of the silicon wafer 215 under the same conditions as those of the first embodiment 1 explained above. In the present embodiment, twenty five silicon wafers are processed for 200 minutes. The thus formed insulating film has an excellent flatness and a fluctuation in the film thickness in a single wafer is 3% and the fluctuation in the film thickness between different wafers is 4%. Further, the deposition of-the ozone-TEOS CVD NSG film is carried out within five seconds after the surface of the silicon wafer is treated by the ethanol. Moreover, the number of particles deposited on the silicon wafer surface and having a diameter smaller than 1 µm is smaller than ten. The above experiment have been conducted ten times and during this test, a malfunction of the wafer transporting mechanism has not occurred.

Figure 26:
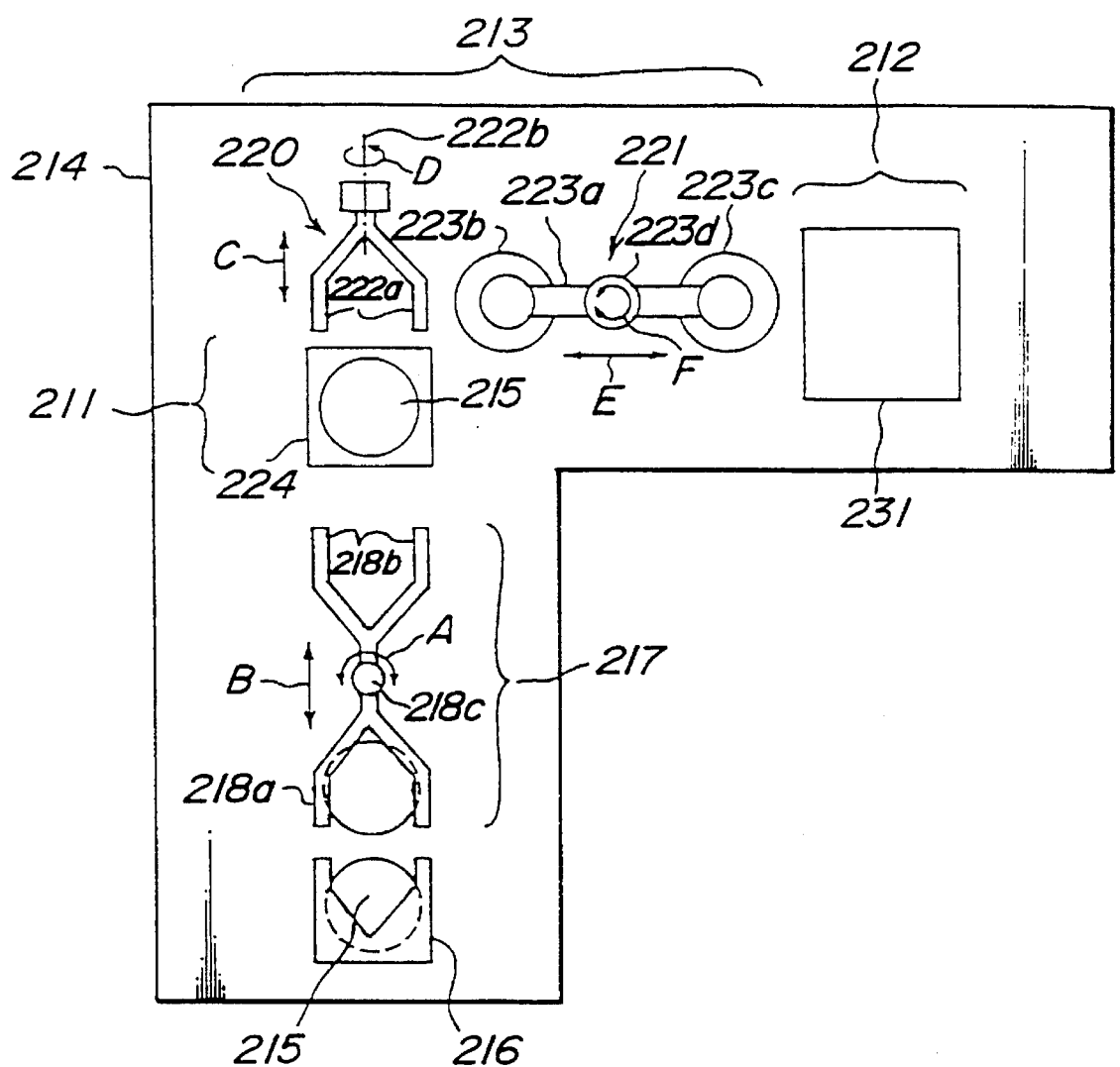
FIG. 26 is a schematic plan view showing another embodiment of the apparatus according to the invention.

FIG. 26 is a schematic plan view showing the construction of another embodiment of the apparatus according to the invention. In the present embodiment, portions similar to those shown in FIG. 25 are denoted by the same reference numerals used in FIG. 25 and their detailed explanation is dispensed with. In the previous embodiment shown in FIG. 25, the pre-treating unit 211 comprises the spin coater, and in the present embodiment the pre-treating unit includes a vapor dryer 224. In this vapor dryer 224, the surface of the silicon wafer 215 is treated by the vapor of the ethanol and then is dried by blowing the nitrogen gas against the wafer. This treatment requires ten seconds for each silicon wafer 215. Also in this embodiment, the silicon wafer can be effectively treated in the same manner as the previous embodiment.

In the above mentioned two embodiments of the semiconductor device manufacturing apparatus according to the invention, the pre-treating unit and vapor depositing unit are arranged on the common base and are installed within the common housing. However, according to the invention, the pre-treating unit and vapor deposition unit may be arranged on separate bases and are installed within separate housings. In such a case, it is necessary to provide an automatic wafer transporting mechanics such as a robot, magnetic floating conveyer mechanics and belt conveyer mechanism.

Figure 27:
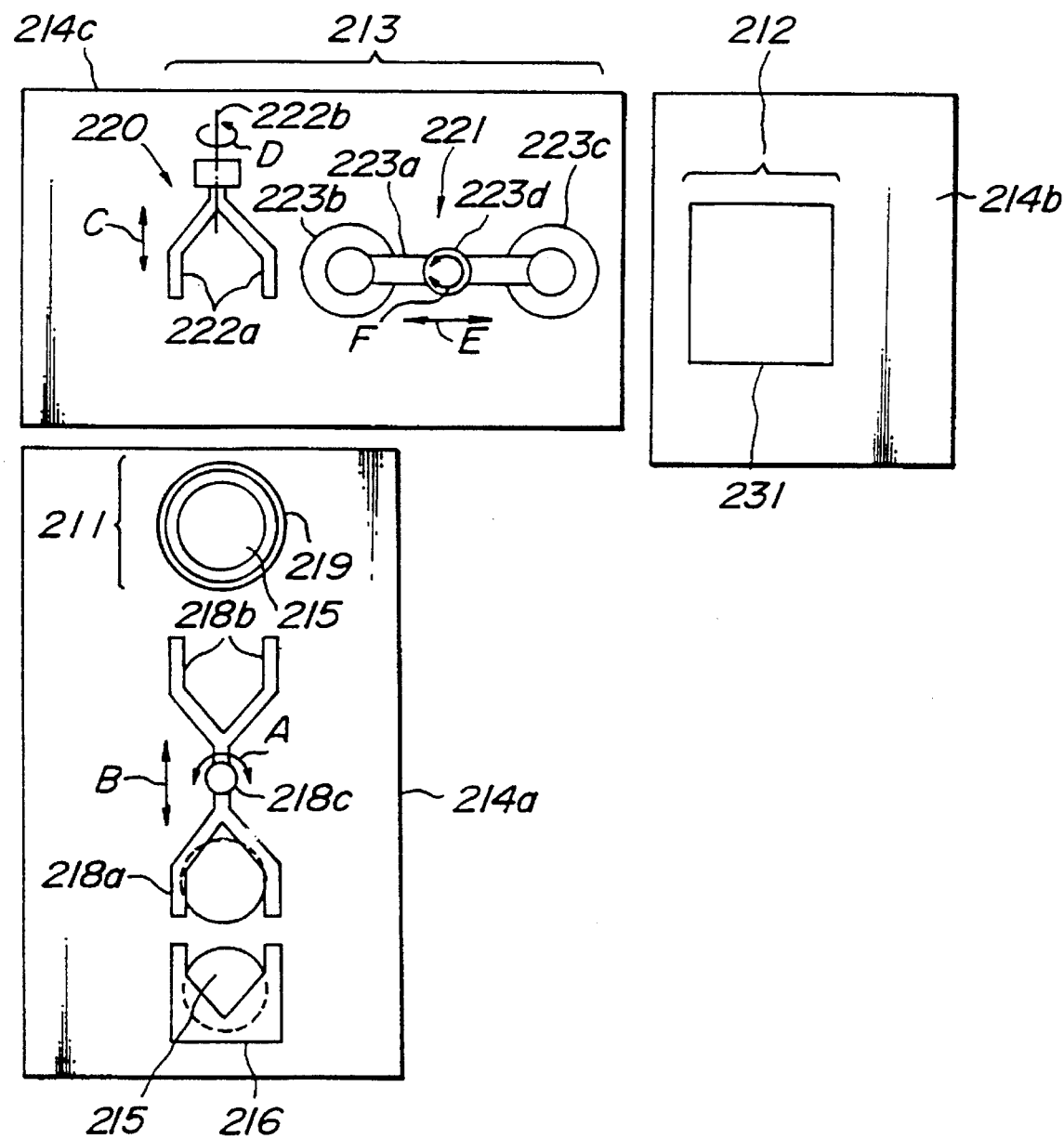
FIG. 27 is a schematic plan view illustrating a first modification of the apparatus shown in FIG. 23.

FIG. 27 is a schematic plan view showing another embodiment of the semiconductor device manufacturing apparatus according to the invention, in which the pre-treating unit and the vapor depositing unit are arranged on separate bases and are installed within separate housings. That is to say, the pre-treating unit 211 is installed within a housing 214a, the vapor depositing unit 212 is installed within a housing 214b, and the transporting unit 213 is provided within a housing 214c. In the pre-treating unit 211, there is arranged the spin coater 219 like as the embodiment shown in FIG. 25.

In the present embodiment, the turning device 220 of the transporting unit 213 is constructed such that the fork-like member 222a can be inserted into the pre-treating unit 211 through openings formed in the housings 214a and 214c. Further the feeding device 221 of the transporting unit 213 can extend into the vapor depositing unit 212 via openings formed in the housings 214b and 214c. These openings can be selectively closed by means of suitable shutters. A mechanism for moving the shutter is well known in the art, so that its explanation is dispensed with.

Figure 28:
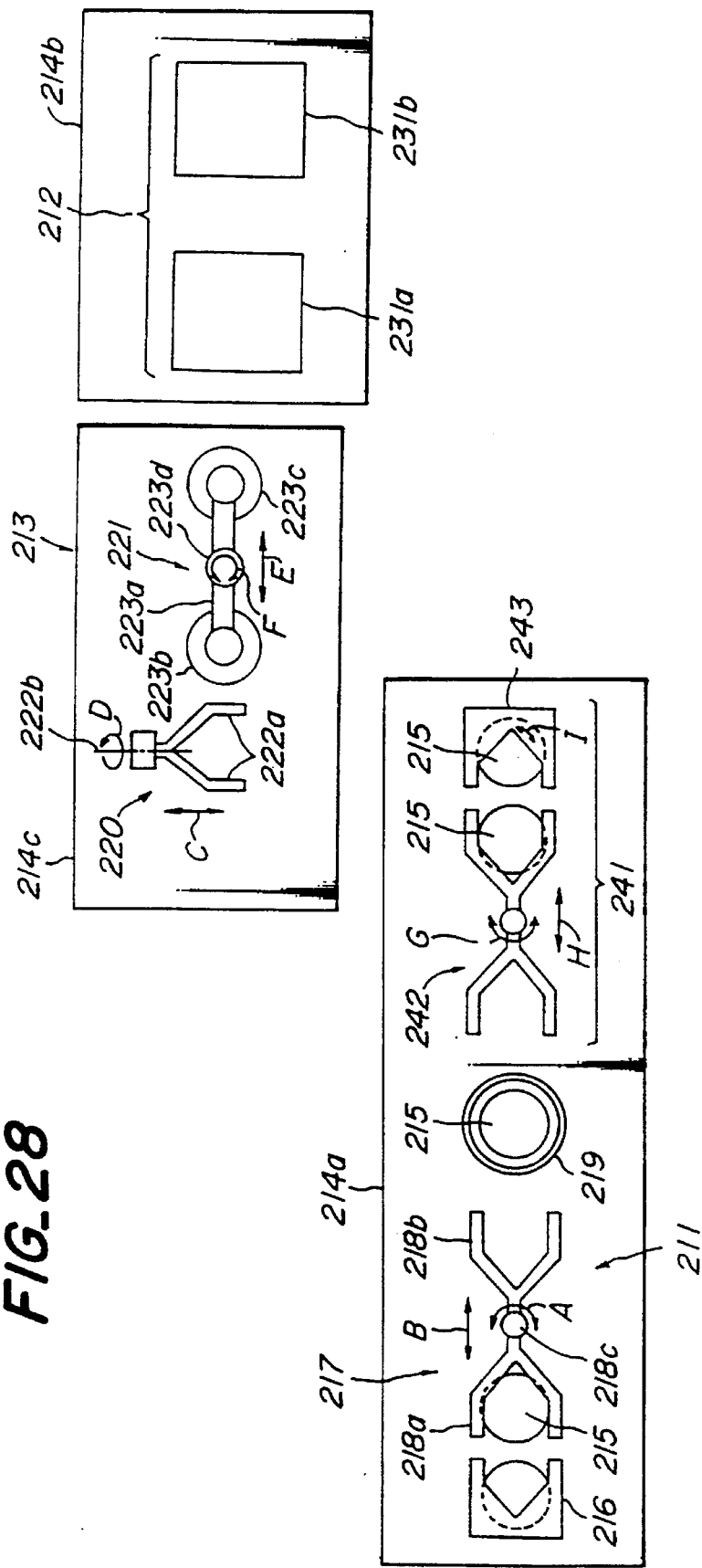
FIG. 28 is a schematic plan view depicting a second modification of the apparatus of FIG. 23.

FIG. 28 is a schematic plan view showing still another embodiment of the semiconductor manufacturing method according to the invention. In the present embodiment, portions similar to the embodiment shown in FIG. 27 are denoted by the same reference numerals used in FIG. 27. The treating time in the pre-treating unit 211 is about twelve seconds for each silicon wafer and the deposition time in the vapor depositing unit 212 is about 420 seconds. Therefore, the throughput is limited by the necessary processing time in the vapor depositing unit 212. In the present embodiment, in the vapor depositing unit 212, there are provided two sets of the chemical vapor deposition devices 231a and 231b, and a wafer buffer 241 is provided in the pre-treating unit 211 as illustrated in FIG. 28. Then, the throughput of the apparatus is improved up to 120 minutes per twenty five wafers.

In the housing 214a, there is arranged the wafer buffer for temporarily stocking silicon wafers 215 whose surfaces have been treated with the ethanol by means of the spin coater 219. The wafer buffer 241 comprises a wafer take-out device 242 and a wafer cassette 243 for stocking the silicon wafers 215. The construction of the wafer take-out device 242 is similar to that of the wafer take-out device 217 of the pre-treating device 211 and its fork-like member can be moved reciprocally as shown by an arrow H and can be rotated about a vertical shaft by 180° as indicated by an arrow G. The wafer cassette 243 can be rotated about a vertical shaft by 90° as shown by an arrow I. When a silicon wafer 215 whose surface has been treated with the ethanol is to be stored in the wafer cassette 243, the wafer cassette is faced toward the spin coater 219 as shown in FIG. 26. Then, the silicon wafer 215 is transported by the wafer take-out device 242 into the wafer cassette 243. When the silicon wafer 215 stored in the wafer cassette 243 is to be taken out of the wafer cassette, the wafer cassette is rotated by 90° to be faced with the turning device 220 of the transporting unit 213. Then, the fork-like member 222a of the turning device 220 is moved toward the wafer cassette 243 beyond the housing 214c and the silicon wafer is taken out of the wafer cassette. Next, the fork-like member 222a supporting the silicon wafer is moved back into the housing 214c. During or after this movement, the fork-like member 222a is rotated by 180° so that the silicon wafer is turned over up side down. Similar to the above embodiments, the silicon wafer is then transferred to the feeding device 221. Next the arm 223a of the feeding device 221 is rotated by 180° and then is moved toward the vapor depositing unit 212. In this manner, the silicon wafer 215 can be transported into one of the reaction chambers of the vapor depositing devices 231a and 231b. In the present embodiment, the silicon wafers can be processed efficiently and the throughput can be increased.

In the embodiments of the semiconductor device manufacturing apparatus according to the invention, chemical vapor deposition for forming the insulating film on the silicon wafer is carried out, while the surface of the silicon wafer is faced downward. However, according to the invention, it is possible to perform the chemical vapor deposition by facing the surface of the silicon wafer upward.

The present invention is not limited to the embodiments so far explained, but many modifications and alternations may be conceived by those skilled in the art within the scope of the invention. For instance, in the above embodiments, the insulating film is deposited on the treated surface by means of the thermal CVD apparatus, but according to the invention, other CVD devices such as plasma CVD device and light enhanced CVD device may be equally used.

What is claimed is:

1. A method of forming an insulating film on a surface of a substrate of a semiconductor device that has protrusions and depressions, comprising the steps of:
   (a) receiving a semiconductor substrate comprising a surface having hydroxyl containing groups thereon;
   (b) adsorbing molecules of at least one organic compound on the surface of said semiconductor substrate using a fluid comprising said at least one organic compound;
   (c) esterifying said hydroxyl containing groups; and
   (d) forming an insulating film on the thus treated surface of the semiconductor substrate by chemical vapor deposition using an organic silicon compound.

2. A method according to claim 1, wherein said organic silicon compound is an organic silane.

3. A method according to claim 2, wherein said organic silane is selected from the group consisting of tetraethoxysilane (TEOS), tetramethoxysilane (TMOS), octamethylcyclotetrasiloxane (OMCTS), hexamethyldisiloxane (ES), trimethylsilyl borate (SOB), diacetoxyditertiary-butoxysilane (DADBS) and trimethylsilyl phosphate (SOP).

4. A method according to claim 2, wherein said chemical vapor deposition in the step (c) is carried out by a thermal chemical vapor deposition using an oxygen gas as a reaction gas to form a thermal CVD oxide film as said insulating film.

5. A method according to claim 4, wherein an ozone gas is further added to said reaction gas to form an ozone-organic silane CVD film as said insulating film.

6. A method according to claim 4, wherein said thermal chemical vapor deposition is carried out under the atmospheric pressure.

7. An apparatus for forming an insulating film on a surface of a substrate of a semiconductor device that has protrusions and depressions, comprising:
   (a) means for receiving a semiconductor substrate comprising a surface having hydroxyl containing groups thereon;
   (b) means for adsorbing molecules of at least one organic compound on the surface of said semiconductor substrate and esterifying said hydroxyl containing groups using a fluid comprising said at least one organic compound; and
   (c) means for forming an insulating film on the surface of the semiconductor substrate by chemical vapor deposition using an organic silicon compound.

8. An apparatus according to claim 7, wherein said means for adsorbing comprises a spin coater.

9. An apparatus according to claim 7, wherein said means for forming comprises a plurality of CVD reaction chambers.

10. An apparatus according to claim 7, wherein said means for forming comprises an atmospheric pressure CVD reaction chamber.

11. A method according to claim 1, wherein said fluid consists essentially of said at least one organic compound in a solvent selected from the group consisting of water and an organic solvent.

* * * * *